(12) United States Patent
Ritter et al.

(10) Patent No.: US 7,414,857 B2
(45) Date of Patent: Aug. 19, 2008

(54) MULTILAYER CERAMIC CAPACITOR WITH INTERNAL CURRENT CANCELLATION AND BOTTOM TERMINALS

(75) Inventors: Andrew P. Ritter, Surfside Beach, SC (US); John L. Galvagni, Surfside Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 11/588,104

(22) Filed: Oct. 26, 2006

(65) Prior Publication Data

US 2007/0096254 A1    May 3, 2007

Related U.S. Application Data

(60) Provisional application No. 60/731,811, filed on Oct. 31, 2005.

(51) Int. Cl.
 *H05H 5/00* (2006.01)
(52) U.S. Cl. .................. 361/756; 361/763; 361/738; 257/532
(58) Field of Classification Search ................ 361/763; 257/532; 336/83, 200
 See application file for complete search history.

(56) References Cited

U.S. PATENT DOCUMENTS

| | | | |
|---|---|---|---|
| 3,444,436 A | 5/1969 | Coda | |
| 4,831,494 A | 5/1989 | Arnold et al. | |
| 5,517,385 A | 5/1996 | Galvagni et al. | |
| 6,243,253 B1 | 6/2001 | DuPre et al. | |
| 6,292,351 B1 | 9/2001 | Ahiko et al. | |
| 0,041,006 A1 | 4/2002 | Ahiko et al. | |
| 6,380,619 B2 | 4/2002 | Ahiko et al. | |
| 6,407,906 B1 | 6/2002 | Ahiko et al. | |
| 6,441,459 B1 | 8/2002 | Togashi et al. | |
| 6,452,781 B1 | 9/2002 | Ahiko et al. | |
| 6,483,692 B2 | 11/2002 | Figueroa et al. | |
| 0,011,963 A1 | 1/2003 | Ahiko et al. | |
| 0,026,059 A1 | 2/2003 | Togashi | |
| 6,576,497 B2 | 6/2003 | Ahiko et al. | |
| 6,606,237 B1 | 8/2003 | Naito et al. | |
| 6,657,848 B2 | 12/2003 | Togashi et al. | |
| 6,661,640 B2 | 12/2003 | Togashi | |
| 6,757,152 B2 | 6/2004 | Galvagni et al. | |
| 6,765,781 B2 | 7/2004 | Togashi | |

(Continued)

*Primary Examiner*—Dean A. Reichard
*Assistant Examiner*—Andargie Aychillhum
(74) *Attorney, Agent, or Firm*—Dority & Manning, P.A.

(57) ABSTRACT

Low inductance capacitors include electrodes that are arranged among dielectric layers and oriented such that the electrodes are substantially perpendicular to a mounting surface. Vertical electrodes are exposed along a device periphery to determine where termination lands are formed, defining a narrow and controlled spacing between the lands that is intended to reduce the current loop area, thus reducing the component inductance. Further reduction in current loop area and thus component equivalent series inductance (ESL) may be provided by interdigitated terminations. Terminations may be formed by various electroless plating techniques, and may be directly soldered to circuit board pads. Terminations may also be located on "ends" of the capacitors to enable electrical testing or to control solder fillet size and shape. Two-terminal devices may be formed as well as devices with multiple terminations on a given bottom (mounting) surface of the device. Terminations may also be formed on the top surface (opposite a designated mounting surface) and may be a mirror image, reverse-mirror image, or different shape relative to the bottom surface.

29 Claims, 28 Drawing Sheets

U.S. PATENT DOCUMENTS

| | | | |
|---|---|---|---|
| 6,768,630 B2 | 7/2004 | Togashi | |
| 6,781,816 B2 | 8/2004 | Togashi | |
| 6,807,047 B2 | 10/2004 | Togashi et al. | |
| 6,816,356 B2 | 11/2004 | Devoe et al. | |
| 6,822,847 B2 | 11/2004 | Devoe et al. | |
| 6,885,544 B2 | 4/2005 | Kim et al. | |
| 6,914,767 B2 | 7/2005 | Togashi et al. | |
| 6,917,510 B1 | 7/2005 | Prymak | |
| 6,922,329 B2 | 7/2005 | Togashi | |
| 6,950,300 B2 | 9/2005 | Sutardja | |
| 6,956,730 B2 | 10/2005 | Togashi | |
| 6,958,899 B2 | 10/2005 | Togashi et al. | |
| 6,965,507 B2 | 11/2005 | Togashi et al. | |
| 6,970,342 B1 | 11/2005 | Togashi | |
| 0,264,977 A1 | 12/2005 | Togashi | |
| 6,995,967 B2 | 2/2006 | Togashi et al. | |
| 6,999,300 B2 | 2/2006 | Togashi et al. | |
| 7,019,957 B2 | 3/2006 | Togashi et al. | |
| 7,019,958 B2 | 3/2006 | Togashi et al. | |
| 7,038,905 B2 | 5/2006 | Yoshihara et al. | |
| 7,050,288 B2 | 5/2006 | Ahiko et al. | |
| 7,050,289 B2 | 5/2006 | Togashi | |
| 7,054,134 B2 | 5/2006 | Togashi et al. | |
| 7,061,747 B2 | 6/2006 | Togashi et al. | |
| 0,152,886 A1 | 7/2006 | Togashi et al. | |
| 0,164,789 A1 | 7/2006 | Togashi et al. | |
| 7,075,774 B2 | 7/2006 | Togashi et al. | |
| 0,176,644 A1 | 8/2006 | Togashi et al. | |
| 7,085,124 B2 | 8/2006 | Togashi | |
| 7,088,569 B1 | 8/2006 | Togashi et al. | |
| 7,099,138 B1 | 8/2006 | Togashi et al. | |
| 0,203,422 A1 | 9/2006 | Togashi | |
| 0,203,425 A1 | 9/2006 | Togashi et al. | |
| 0,203,426 A1 | 9/2006 | Togashi et al. | |
| 0,203,427 A1 | 9/2006 | Togashi et al. | |
| 0,209,492 A1 | 9/2006 | Togashi | |
| 0,221,545 A1 | 10/2006 | Togashi | |
| 0,221,546 A1 | 10/2006 | Togashi | |
| 7,145,429 B1 | 12/2006 | Togashi et al. | |
| 7,152,291 B2 | 12/2006 | Ritter et al. | |
| 7,230,816 B2 | 6/2007 | Sutardja | |
| 7,283,348 B2 | 10/2007 | Togashi et al. | |
| 7,298,604 B2 | 11/2007 | Togashi et al. | |
| 0,049,377 A1 | 2/2008 | Sutardja | |
| 2004/0184202 A1 | 9/2004 | Togashi et al. | |
| 2005/0047059 A1 | 3/2005 | Togashi | |
| 2006/0028785 A1 | 2/2006 | Togashi et al. | |
| 2006/0133057 A1* | 6/2006 | McGregor et al. | 361/763 |
| 2006/0214263 A1* | 9/2006 | Kojima et al. | 257/532 |

* cited by examiner

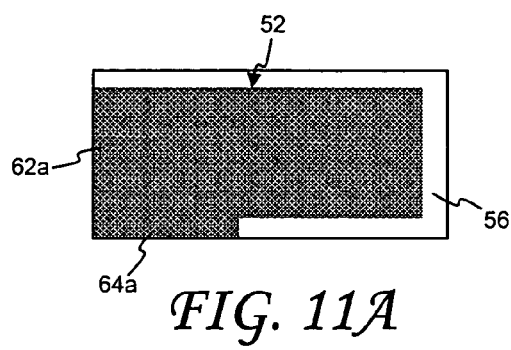
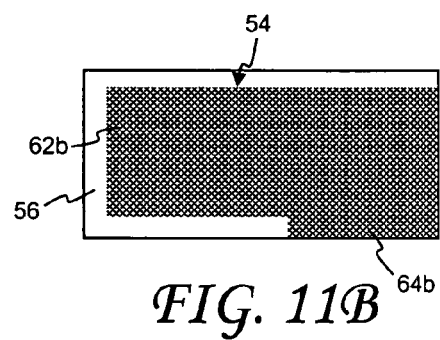
FIG. 11A    FIG. 11B
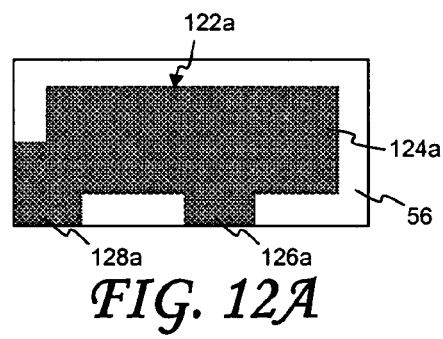
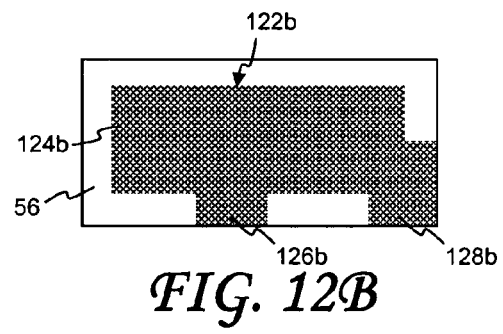
FIG. 12A    FIG. 12B

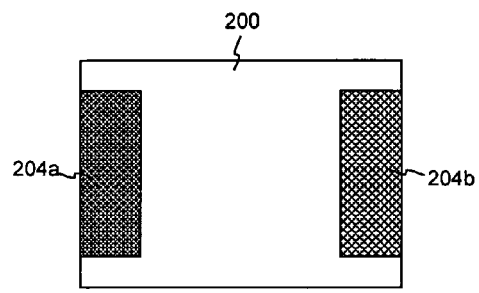
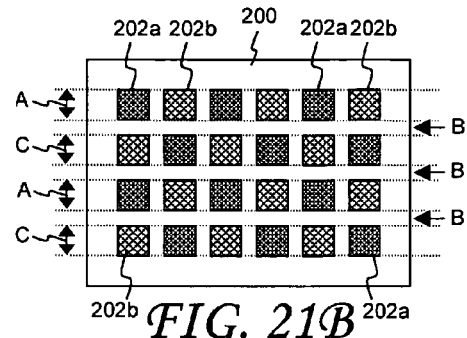
FIG. 21A    FIG. 21B
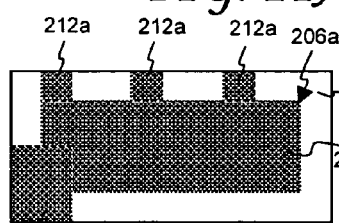
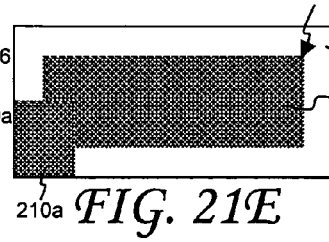
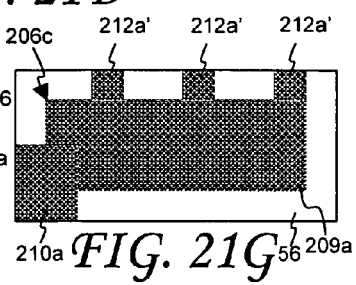
FIG. 21C    FIG. 21E    FIG. 21G
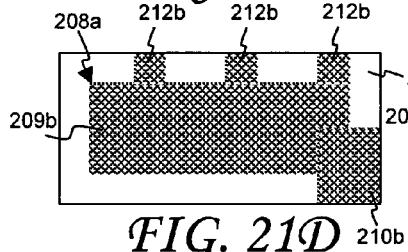
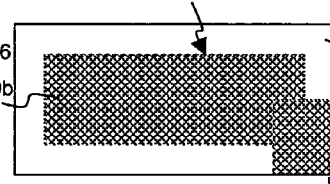
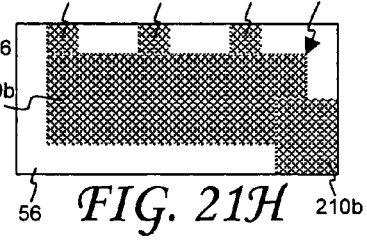
FIG. 21D    FIG. 21F    FIG. 21H
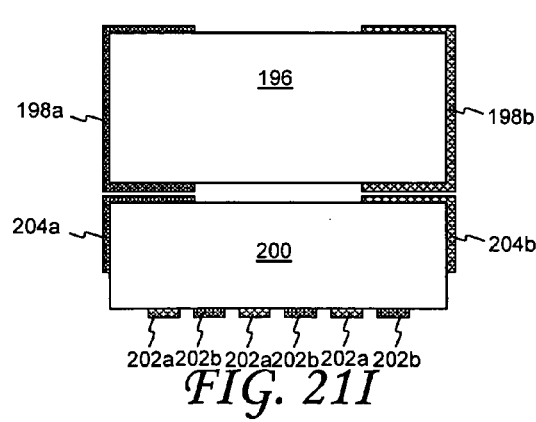
FIG. 21I

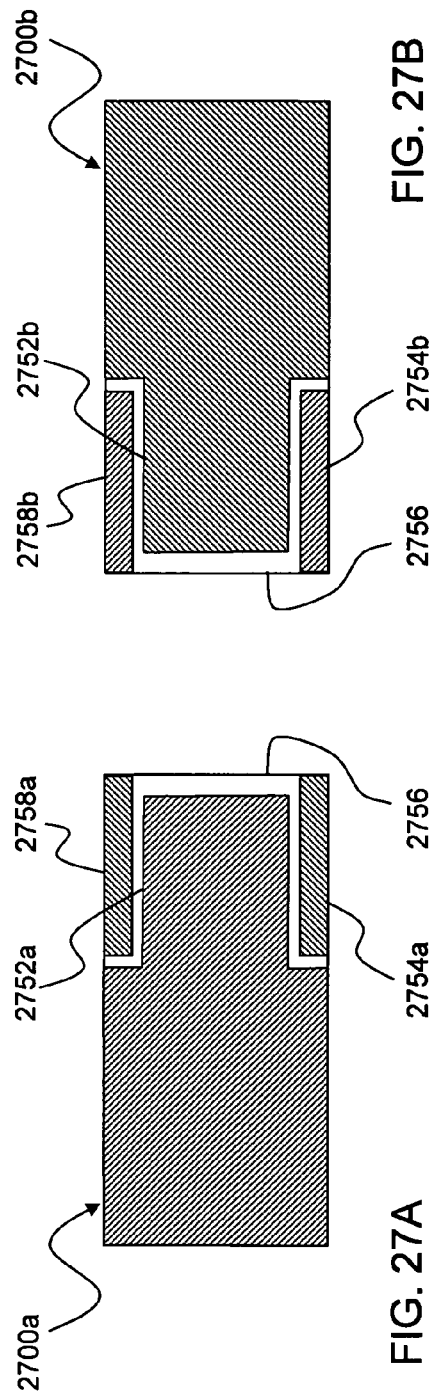
FIG. 27A
FIG. 27B
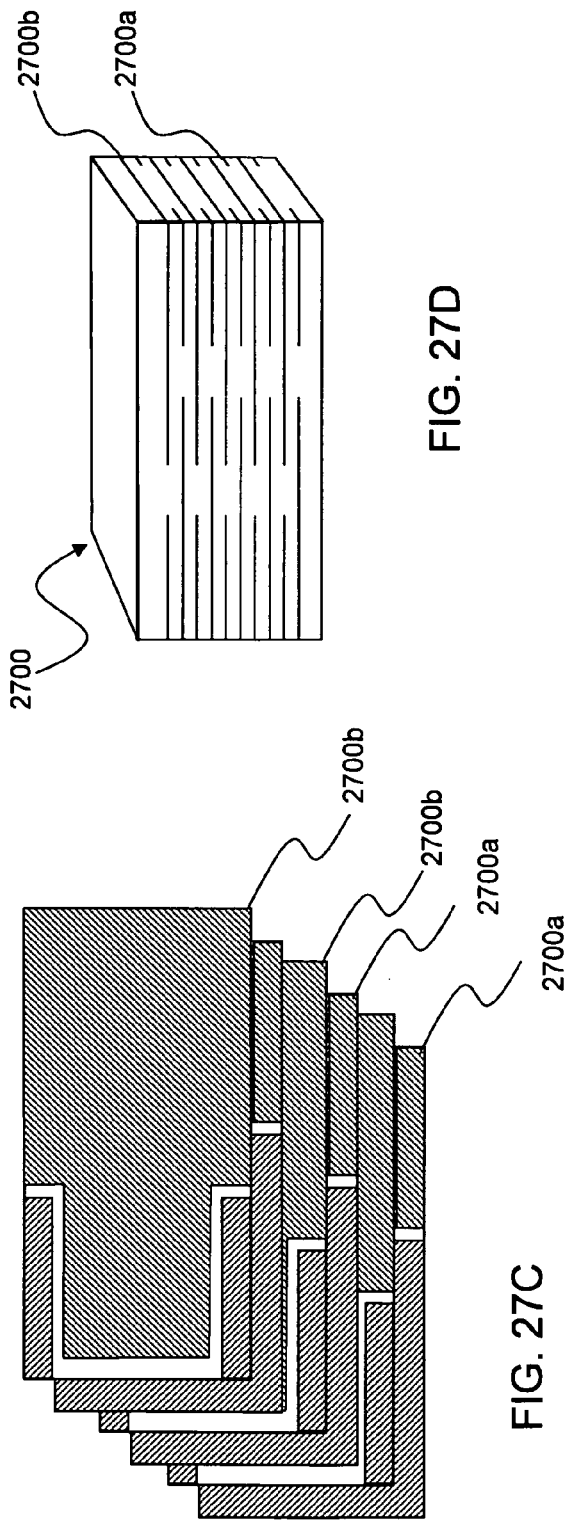
FIG. 27D
FIG. 27C

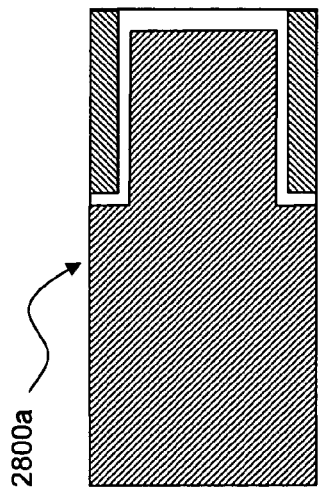
FIG. 28A
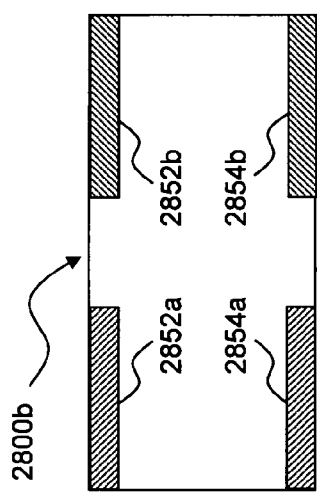
FIG. 28B
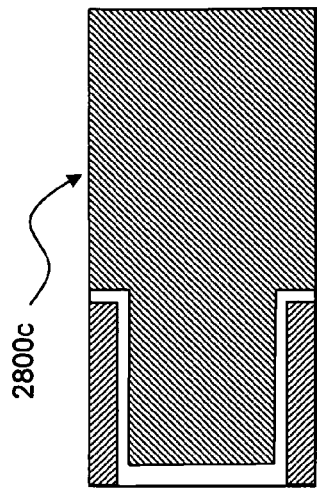
FIG. 28C
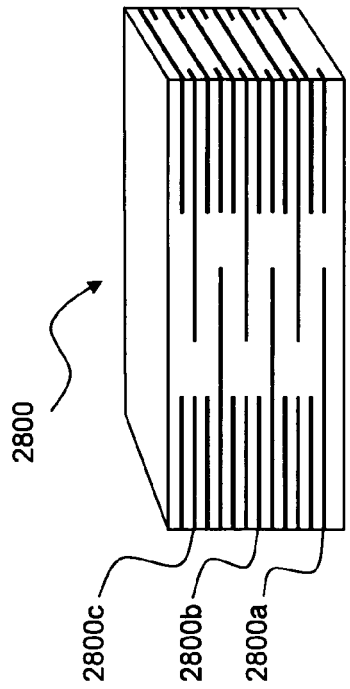
FIG. 28E
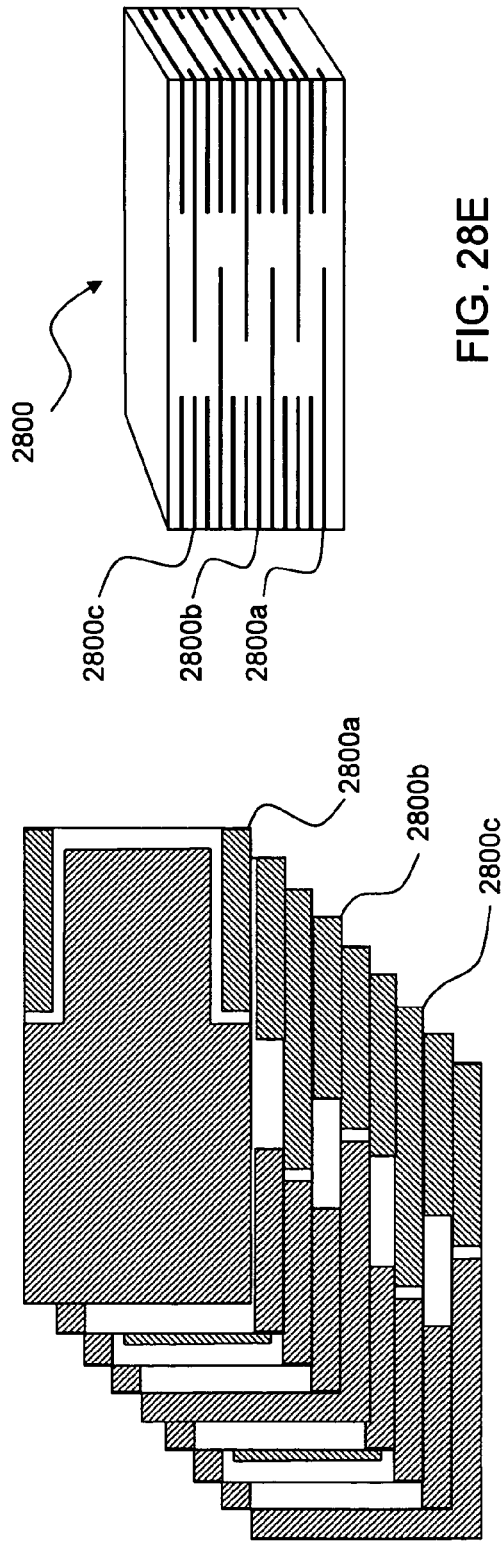
FIG. 28D (A-B-C-B)

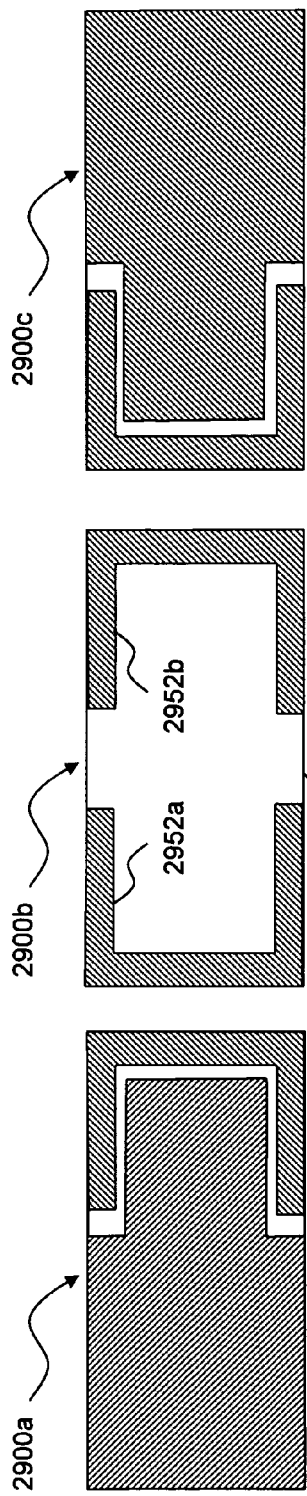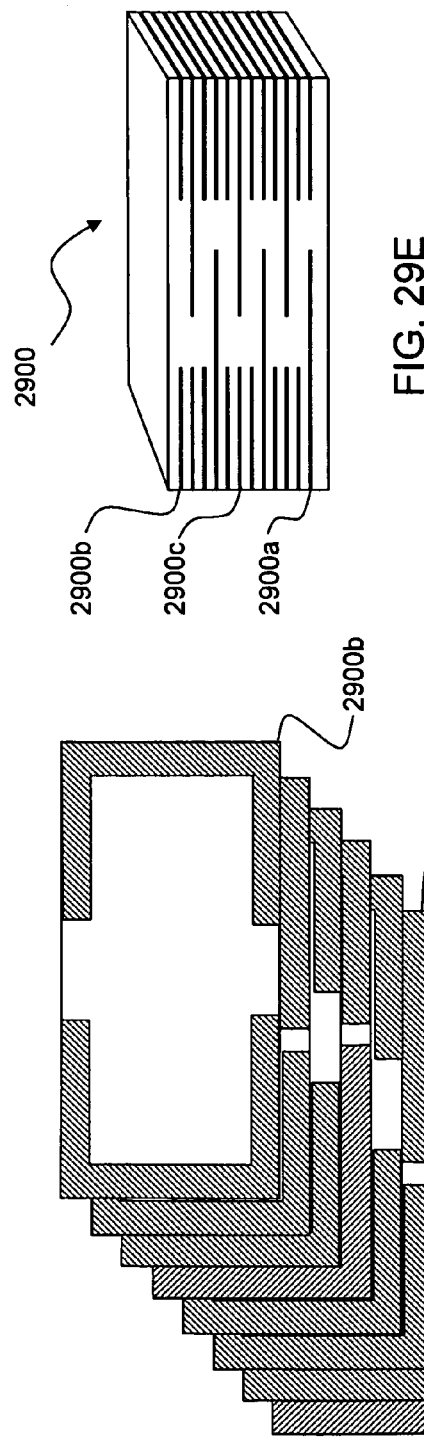
FIG. 29C
FIG. 29B
FIG. 29A
FIG. 29E
FIG. 29D (A-B-C-B)

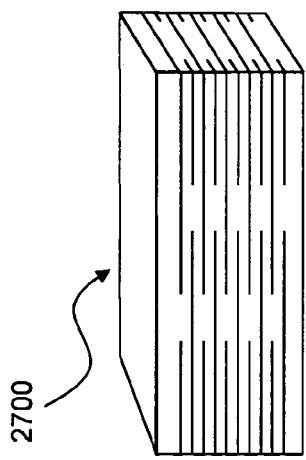
FIG. 30A
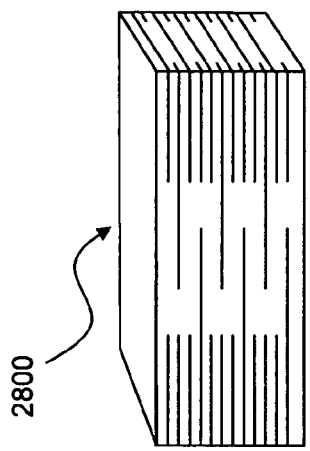
FIG. 30D
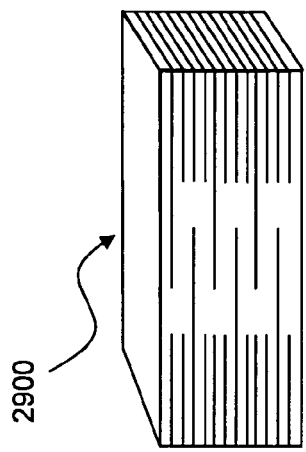
FIG. 30G
FIG. 30B
FIG. 30E
FIG. 30H
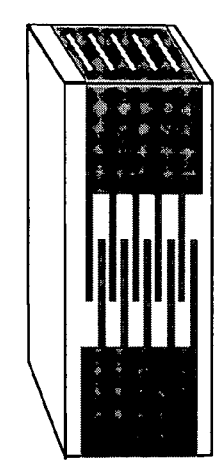
FIG. 30C
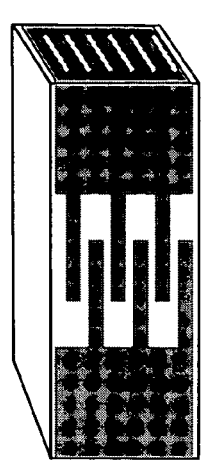
FIG. 30F
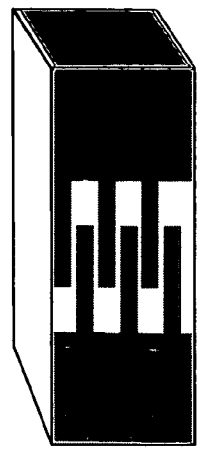
FIG. 30I

MULTILAYER CERAMIC CAPACITOR WITH INTERNAL CURRENT CANCELLATION AND BOTTOM TERMINALS

PRIORITY CLAIM

This application claims priority under 35 U.S.C. 119(e) of U.S. Provisional Patent Application Ser. No. 60/731,811 filed Oct. 31, 2005, entitled "LOW INDUCTANCE CAPACITOR WITH EXTENDED LANDS AND VERTICAL ELECTRODE," which is hereby incorporated by reference in its entirety for all purposes.

BACKGROUND OF THE INVENTION

The present subject matter generally concerns improved component design for decoupling capacitors that generally results in devices characterized by relatively low cost, low inductance and low Equivalent Series Resistance (ESR).

As switching speeds increase and pulse rise times decrease in electronic circuit applications, the need to reduce inductance becomes a serious limitation for improved system performance. Even the decoupling capacitors, that act as a local energy source, can generate unacceptable voltage spikes: V=L (di/dt). Thus, in high speed circuits where di/dt can be quite large, the size of the potential voltage spikes can only be reduced by reducing the inductance value L.

The prior art includes several strategies for reducing equivalent series inductance, or ESL, of chip capacitors compared to standard multilayer chip capacitors. A first exemplary strategy involves reverse geometry termination, such as employed in low inductance chip capacitor (LICC) designs such as manufactured and sold by AVX Corporation. In LICCs, electrodes are terminated on the long side of a chip instead of the short side. Since the total inductance of a chip capacitor is determined in part by its length to width ratio, LICC reverse geometry termination results in a reduction in inductance by as much as a factor of six from conventional MLC chips.

Interdigitated capacitors (IDCs) incorporate a second known strategy for reducing capacitor inductance. IDCs incorporate electrodes having a main portion and multiple tab portions that connect to respective terminations formed on the capacitor periphery. Multiple such terminations can help reduce the parasitic inductance of a device. Examples of interdigitated capacitors are disclosed in U.S. Pat. No. 6,243,253 (DuPre et al.)

A still further known technology utilized for reduction in capacitor inductance involves designing alternative current paths to minimize the mutual inductance factor of capacitor electrodes. A low inductance chip array (LICA) product, such as manufactured and sold by AVX Corporation, minimizes mutual inductance by configuring a ball grid array multilayer capacitor such that the charging current flowing out of a positive plate returns in the opposite direction along an adjacent negative plate. Utilization of LICA technology achieves low inductance values by low aspect ratio of the electrodes, an arrangement of electrode tabs so as to cancel inductance and vertical aspect of the electrodes to the mounting surface.

Additional references that incorporate adjacent electrodes having reverse current paths used to minimize inductance include U.S. Published Patent Application No. 2005/0047059 (Togashi et al.) and U.S. Pat. No. 6,292,351 (Ahiko et al.) Both such references also utilize a vertical aspect of electrodes relative to a mounting surface. Additional references that disclose electrodes for use in a vertically-oriented position include U.S. Pat. Nos. 5,517,385 (Galvagni et al.), 4,831,494 (Arnold et al.) and 6,885,544 (Kim et al.)

A known reference that discloses features aimed to reduce inductance in an integrated circuit package that includes, in part, a capacitive device is U.S. Pat. No. 6,483,692 (Fiqueroa et al.). Such reference recognizes that inductance relates to circuit board "loop area" or the electrical distance (or span) that current must follow. It is desirable in Figeuroa et al. to minimize such loop area, thus reducing the inductance levels. Extended surface lands are also provided in Figueroa et al., providing a larger surface area that is said to result in more reliable connections characterized by reduced inductance and resistance levels.

U.S. Pat. No. 6,661,640 (Togashi) also discloses features for reducing ESL of a decoupling capacitor by maximizing the surface area of device terminations. U.S. Pat. No. 6,917,510 (Prymak) discloses a capacitor embodiment with terminal extensions formed to result in a narrow gap between the electrodes. The end electrodes of U.S. Pat. No. 6,822,847 (Devoe et al.) also cover all but a thin separation line at a central portion of the capacitor body.

Still further known references that include features for reducing component inductance correspond to U.S. Pat. Nos. 6,757,152 (Galvagni et al.) and 6,606,237 (Naito et al.), in which conductive vias are utilized to form generally low inductance connections to upper electrodes in a multilayer capacitor.

Additional background references that may address certain aspects of low-inductance multilayer electronic devices include U.S. Pat. Nos. 6,576,497 (Ahiko et al.) and 3,444,436 (Coda) as well as U.S. Published Patent Application No. 2004/0184202 (Togashi et al.).

While various aspects and alternative features are known in the field of multilayer electronic components and related methods for manufacture, no one design has emerged that generally addresses all of the issues as discussed herein. The disclosures of all the foregoing United States patents and published patent applications are hereby fully incorporated into this application for all purposes by virtue of present reference thereto.

BRIEF SUMMARY OF THE INVENTION

The present subject matter recognizes and addresses various of the foregoing aspects of decoupling capacitors and a desire for reduced inductance in such devices. Thus, broadly speaking, a principal object of the presently disclosed technology is improved capacitor configurations that result in relatively lower overall inductance.

Additional advantages afforded by embodiments of the present technology include simple design, low cost, low ESR, and improved mechanical robustness. Such advantages may be particularly useful for computer processing and other high-frequency electronics applications, and may offer a desirable alternative to conventional low-inductance decoupling capacitor designs.

One exemplary present multilayer electronic component embodiment includes a plurality of first electrode layers, each first electrode layer comprising a first dielectric layer having first and second surfaces thereof bounded by four edges and a first conductive layer covering a portion of such first surface of such first dielectric layer and extending to at least a portion of one edge of such first dielectric layer; a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer and extending to at least a portion of one edge of such second dielectric layer, the second conductive layer formed as a mirror image of the first conductive layer; a first conductive termination layer covering a portion of such at least one edge of such first electrode layer and electrically connecting such first conductive layer of each of such plurality of first electrode layers; and a second conductive termination layer covering a portion of such at least one edge of such second electrode layer and electrically connecting such second conductive layer of each of such plurality of second electrode layers.

In the foregoing exemplary embodiment, preferably such first conductive termination layer and such second conductive termination layer are configured so as to form a gap therebetween along a portion of such at least one edge of both such first and second electrode layers, whereby a minimum current loop area if formed from such first conductive termination layer through such plurality of first electrode layers and plurality of second electrode layers to such second conductive termination layer.

In another present exemplary multilayer electronic component embodiment, there are included a plurality of first electrode layers, each first electrode layer comprising: a first dielectric layer having first and second surfaces thereof bounded by four edges; a first conductive layer covering a portion of one of such first and second surfaces of such first dielectric layer and extending to at least a portion of one edge of such first dielectric layer; and a second conductive layer covering a portion of one of such first and second surfaces of such first dielectric layer and extending to at least a portion of such one edge of such first dielectric layer; and there are included a plurality of second electrode layers alternately stacked with such plurality of first electrode layers, each second electrode layer comprising: a second dielectric layer having first and second surfaces thereof bounded by four edges; a third conductive layer covering a portion of one of such first and second surfaces of such second dielectric layer and extending to at least a portion of one edge of such second dielectric layer; and a fourth conductive layer covering a portion of one of such first and second surfaces of such second dielectric layer and extending to at least a portion of such one edge of such second dielectric layer; and are further included a first conductive termination layer covering a portion of such at least one edge of such pluralities of first and second electrode layers and electrically connecting such first conductive layer of each of such plurality of first electrode layers and such fourth conductive layer of such second electrode layer; and a second conductive termination layer covering a portion of such at least one edge of such pluralities of first and second electrode layers and electrically connecting such second conductive layer of each of such plurality of first electrode layers to such third conductive layer of such second electrode layer.

In the foregoing further exemplary embodiment, preferably the first conductive termination layer and the second conductive termination layer are configured so as to form a gap therebetween along a portion of the at least one edge of both the first and second electrode layers, whereby a minimum current loop area if formed from the first conductive termination layer through such plurality of first electrode layers and plurality of second electrode layers to the second conductive termination layer.

It is to be understood that the present subject matter equally pertains to corresponding methodologies. One exemplary such method relates to a method of making a low equivalent series inductance (ESL) multilayer electronic component. Such method preferably comprises providing a plurality of first electrode layers, each first electrode layer comprising a first dielectric layer having first and second surfaces thereof bounded by four edges and a first conductive layer covering a portion of one of said first and second surfaces of said first dielectric layer and extending to at least a portion of one edge of said first dielectric layer; providing a plurality of second electrode layers, each second electrode layer comprising a second dielectric layer having first and second surfaces thereof bounded by four edges and a second conductive layer covering a portion of one of said first and second surfaces of said second dielectric layer and extending to at least a portion of one edge of said second dielectric layer, with the second conductive layer formed as a mirror image of the first conductive layer; stacking the first and second plurality of electrode layers in respective alternating layers; providing a first conductive termination layer electrically connecting respective first conductive layers of said plurality of first electrode layers; providing a second conductive termination layer electrically connecting respective second conductive layers of said plurality of second electrode layers; and configuring the first and second conductive termination layers so as to form a gap therebetween along a portion of said at least one edge of both said first and second electrode layers.

It is to be understood that yet further present methods may include additional steps or aspects. For example, one present exemplary method with respect to the above-referenced step of configuring may additionally include configuring the first and second conductive termination layers so as to form plural interdigitated fingers separated by gaps over a surface formed from the stack of electrode layers comprising said one edge of each of the stacked first and second plurality of electrode layers. In yet additional present exemplary methodologies, present subject matter may include masking a portion of the interdigitated fingers prior to the respective steps of providing the first and second conductive termination layers, so that such masking inhibits shorting of the interdigitated fingers during the respective steps of providing the first and second termination layers.

Low inductance advantages of certain of the present embodiments are realized in part by the configuration of internal electrodes and peripheral termination lands. Variously selected electrode configurations may be utilized and oriented within a multilayer capacitor in a mounting position such that the electrodes are substantially perpendicular to the mounting surface. Such "vertical electrodes" extend to and are exposed along the periphery of the capacitor where termination lands are formed thereon. Terminations may be formed, for example, by various electroless or electrolytic plating techniques as disclosed herein. The exposed portions of vertical electrodes and corresponding termination lands are formed to define a narrow and controlled spacing between the lands that is intended to reduce the current loop area, thus reducing the component inductance. Such gap may be formed to be between about 100 and 400 microns in some exemplary embodiments. Electrode exposure and corresponding terminations may also be located on "ends" of the capacitors to enable electrical testing or to control solder fillet size and shape.

Another advantage in accordance with the presently disclosed technology concerns the ease of attachment afforded by the particularly configured termination land locations. Ball grid array (BGA) technology is not required, and so the termination lands can be directly soldered to circuit board pads (as in accordance with land grid array (LGA) technology) and no solder balls are needed.

Still further advantages correspond to the versatility in available design options for the subject capacitors. Different electrode configurations may be employed with terminations on one or more device surfaces. Two-terminal devices may be formed as well as devices with multiple terminations on a given mounting surface of the device. Terminations may also be formed on the surface opposite the mounting surface and may be a mirror image, reverse-mirror image, or different shape relative to the bottom surface.

Various additional objects and advantages are provided by present embodiments which adhere to the present exemplary features that the current loop area should be minimized by a) minimizing the gap between the opposing polarity internal electrode tabs, b) matching the external termination to the exposed tabs that define that gap, and c) minimizing the "height" of the bottom cover layer and the current loop span (the direction perpendicular to current flow) should be maximized, which gives rise to certain present design variations such as a present multi-terminal LGA and the present interleaved features.

Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features hereof may be practiced in various embodiments and uses of the disclosed technology without departing from the spirit and scope thereof, by virtue of present reference thereto. Such variations may include, but are not limited to, substitution of equivalent means and features, or materials for those shown, referenced, or discussed, and the functional, operational, or positional reversal of various parts, features, or the like.

Still further, it is to be understood that different embodiments, as well as different presently preferred embodiments, of this subject matter may include various combinations or configurations of presently disclosed features or elements, or their equivalents (including combinations of features or configurations thereof not expressly shown in the figures or stated in the detailed description). Those of ordinary skill in the art will better appreciate the features and aspects of such embodiments, and others, upon review of the remainder of the specification.

BRIEF DESCRIPTION OF THE SEVERAL VIEWS OF THE DRAWING

A full and enabling description of the present subject matter, including the best mode thereof, directed to one of ordinary skill in the art, is set forth in the specification, which makes reference to the appended figures, in which:

FIGS. 11A and 11B provide plan views of a first example of respective first and second polarity electrodes for use in a capacitor embodiment of the present technology;

FIGS. 12A and 12B provide plan views of a second example of respective first and second polarity electrodes for use in a capacitor embodiment of the present technology;

FIGS. 21A and 21B provide respective top and bottom views of opposing mounting surfaces of a capacitor embodiment of the present technology incorporating an eleventh example of respective first and second polarity electrodes, such as those illustrated in the respective plan views of FIGS. 21C-21H;

FIG. 21I provides a side view of a terminated capacitor such as illustrated in FIGS. 21A and 21B when mounted to another electronic component;

FIGS. 27A and 27B illustrate respectively first and second electrode layers as may be stacked to provide an embodiment of the present subject matter incorporating an electrically floating anchor tab feature;

FIG. 27C illustrates in exploded view a stack of electrodes alternately corresponding to those illustrated in FIGS. 27A and 27B;

FIG. 27D is a perspective view of a partially assembled capacitor in accordance with the first anchor tab feature embodiment of the present subject matter prior to termination illustrating the alternating electrode layers;

FIGS. 28A and 28C illustrate respectively first and second electrode layers as may be stacked to provided a further embodiment of the present subject matter incorporating an electrically floating anchor tab feature;

FIG. 28B illustrates an insulating layer with anchor tab layers that may be stacked among the electrodes illustrated in FIGS. 28A and 28C;

FIG. 28D illustrates in exploded view a stack of electrode and insulating layers corresponding to those illustrated in FIGS. 28A, 28B, and 28C;

FIG. 28E is a perspective view of a partially assembled capacitor in accordance with the second anchor tab feature embodiment of the present subject matter prior to termination, and illustrating present alternating electrode layers;

FIGS. 29A and 29C illustrate respectively first and second electrode layers as may be stacked to provide still another embodiment of the present subject matter incorporating an electrically floating anchor tab feature;

FIG. 29B illustrates an insulating layer with U-shaped anchor tab layers that may be stacked among the electrodes illustrated in FIGS. 29A and 29C;

FIG. 29D illustrates in exploded view a stack of electrode and insulating layers corresponding to those illustrated in FIGS. 29A, 29B, and 29C;

FIG. 29E is a perspective view of a partially assembled capacitor in accordance with the third anchor tab feature embodiment of the present subject matter prior to termination illustrating the alternating electrode layers;

FIGS. 30A through 30C, 30D through 30F, and 30G through 30I respectively illustrate perspective views of the embodiments illustrated in FIGS. 27 through 29 and show plating sequences for the different anchor tab embodiments;

Figure 1:
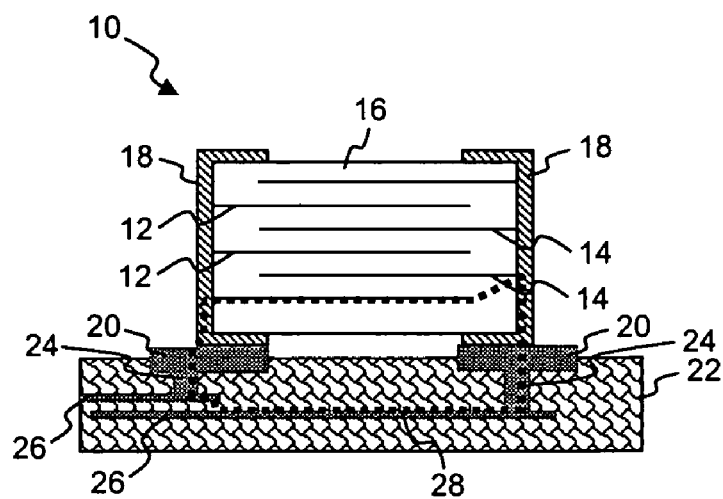
FIG. 1 depicts aspects of a current loop for a first known (i.e., prior art) exemplary capacitor embodiment.

Repeat use of reference characters throughout the present specification and appended drawings is intended to represent same or analogous features or elements of the present subject matter.

DETAILED DESCRIPTION OF THE PREFERRED EMBODIMENTS

The present subject matter is directed towards improved component design for decoupling capacitors that selectively incorporates closely spaced termination gaps and/or vertically oriented electrodes to provide parts with relatively low inductance and low ESR.

As referenced in the Background of the Invention section, supra, many known systems and methods have been directed to the formation of multilayer electronic components characterized by low inductance and/or low ESR values. Examples of such known technologies include components that incorporate one or more of a reverse geometry termination, interdigitated capacitor electrodes, or ball grid arrays with alternating current flow in adjacent electrodes. Central to each of the aforementioned approaches is a goal to minimize the area of the current carrying loop formed between the capacitor and its mounting location. Assuming that a mounting location corresponds to a conventional circuit board, such a current carrying loop is formed in part by the following respective features: the internal electrodes closest to the circuit board, the power planes of the circuit board closest to the capacitor, the termination of the capacitor and the vias between the solder pads and the board power planes.

Figure 2:
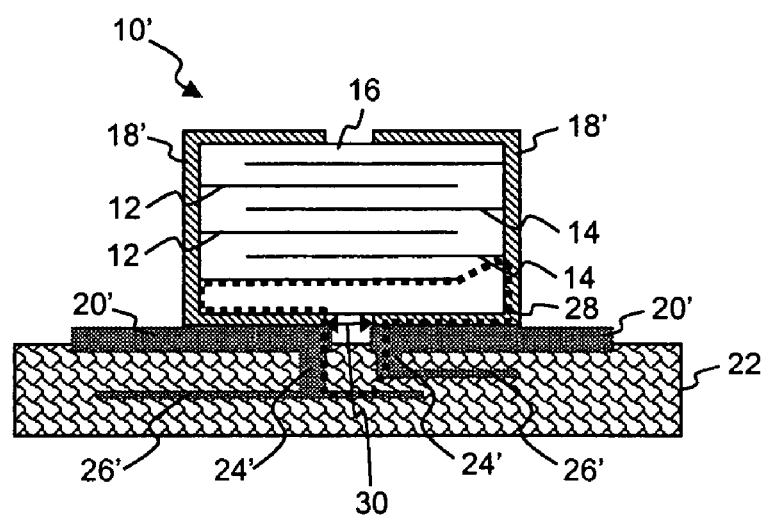
FIG. 2 depicts aspects of a current loop for a second known (i.e., prior art) exemplary capacitor embodiment.

FIGS. 1 and 2 respectively illustrate aspects of such a current carrying loop for two exemplary prior art capacitors mounted to respective circuit boards. A first prior art capacitor 10, as represented in FIG. 1, corresponds to a multilayer device including multiple first electrodes 12 and second electrodes 14 disposed within a body of dielectric material 16. Each first electrode 12 is paired with a second electrode 14 of opposite polarity to form opposing capacitor plates. Two thick-film termination stripes 18 are formed on either side of capacitor 10 to respectively connect multiple internal electrodes of the same polarity and provide respective peripheral locations for mounting the component. Portions of terminations 18 are coupled to solder pads 20 formed on a circuit board 22. (It should be appreciated that in FIG. 1 and other figures which depict connection between a chip component and a circuit board that only a portion of such circuit board is shown for ease of illustration.) Vias 24 internal to circuit board 22 connect solder pads 20 to the power planes 26 associated with board 22.

Referring still to FIG. 1, the current loop in such exemplary embodiment is represented by dotted line 28, which flows from the second electrode 14 closest to circuit board 22 through the first electrode 12 closest to circuit board 22 through the circuit board vias 24 and through the power planes 26 running between vias 24. The area defined by the two-dimensional view of current loop 28 in FIG. 1 is the current loop area.

A goal in accordance with aspects of the present subject matter is to reduce as much as possible this current loop area, which is a function of both the length and width of such current loop. A related aspect of current loop that also contributes to overall device inductance is what will be referred to herein as the "span" of the current loop. Current does not travel in a two-dimensional line as represented by the current loop 28 of FIG. 1 and other subsequent figures. The current loop is spread across a third capacitor dimension perpendicular to current flow. For example, in FIG. 1, the current loop span extends from front to back of the capacitor (a direction perpendicular to the plane shown in FIG. 1). While it is advantageous to reduce the current loop area, it may be advantageous to increase or maximize the current loop span. Capacitors formed with the presently disclosed features, selectively including vertical electrodes and/or extended lands, are generally characterized as having lower ESL in proportion to the current loop span compared to other known capacitor configurations.

Referring to FIG. 2, an exemplary prior art capacitor embodiment 10' includes first electrodes 12 and second electrodes 14 disposed in a body of dielectric material 16, similar to the arrangement of FIG. 1. Peripheral terminations 18' are also provided to respectively connect multiple internal electrodes of the same polarity. Compared to terminations 18 of FIG. 1, terminations 18' of FIG. 2 extend further along the top and bottom surfaces of capacitor 10' to meet with the board vias 24' that are spaced closer together than the vias 24 of FIG. 1. Terminations 18' of FIG. 2 form extended lands that, coupled with the closer location of vias 24', help decrease the area defined by the current loop 28' compared to that of FIG. 1.

Figure 3:
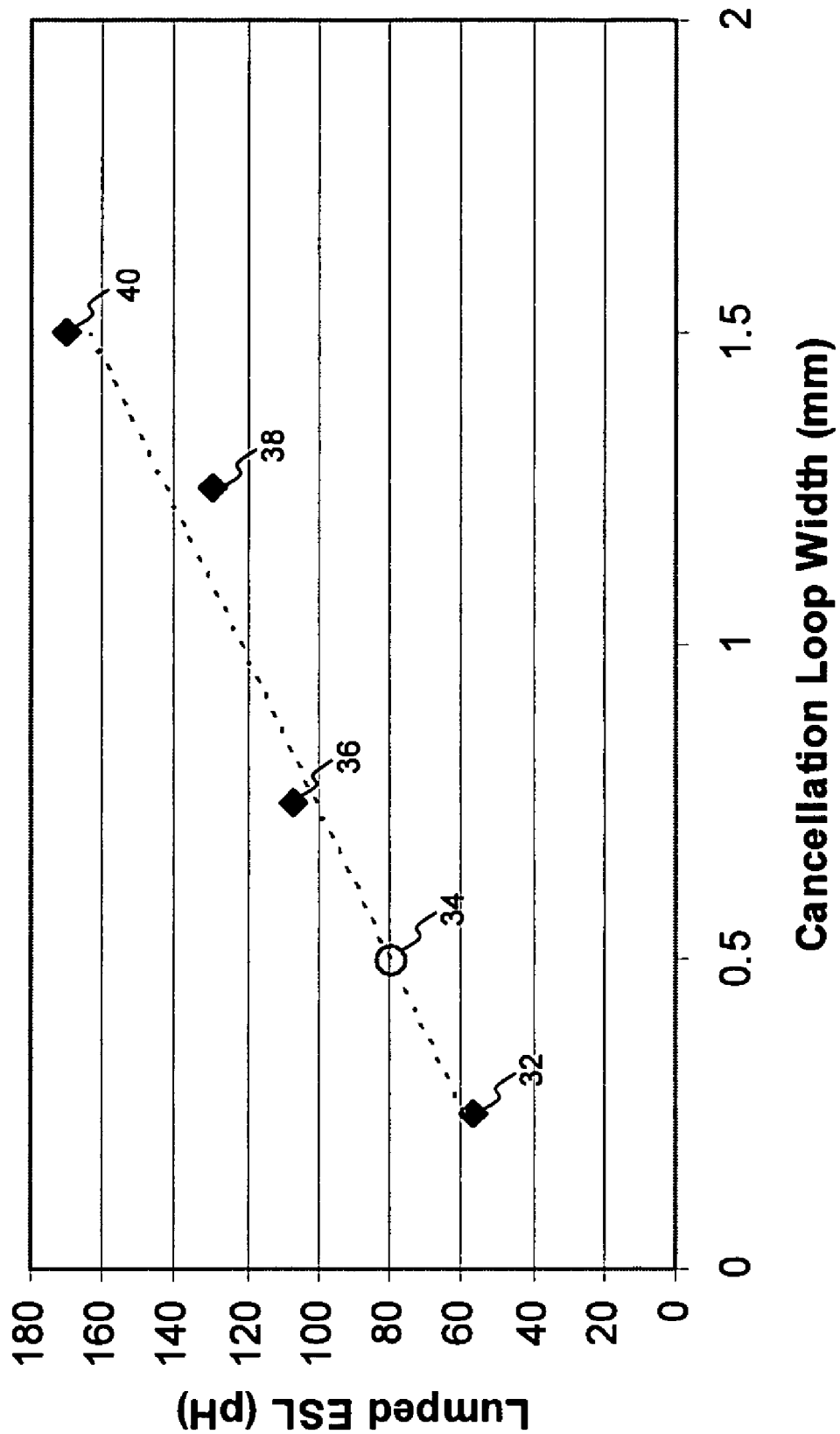
FIG. 3 provides a graphical illustration of a general inductance trend for low inductance chip capacitors, especially depicting lumped ESL values versus cancellation loop width for multiple exemplary capacitor embodiments of differing sizes.

A related illustration of how current loop area in a capacitor affects the overall inductance of such devices can be recognized in the graph of FIG. 3. The graph of FIG. 3 provides an inductance trend that plots the lumped ESL in picoHenries (pH) versus the width of the current area loop in millimeters (mm). Data point 32 corresponds to the measured ESL value for a capacitor chip having an 0102 case size. It should be appreciated that a case size of "xxyy" is a reference standard developed by the EIA (Electronic Industries Association) to designate a chip device having dimensions of approximately 0.xx by 0.yy inches. Thus, for example, an 0102 chip has length and width dimensions of 0.01 inches by 0.02 inches. The width dimension (referred to in FIG. 3 as the Cancellation Loop Width) directly contributes to the current loop area already discussed. An 0102 chip has a cancellation loop width of about 0.25 mm. This width dimension increases for capacitors having larger case sizes, thus increasing the overall ESL values as illustrated in FIG. 3. Data point 34 corresponds to the predicted ESL value for an 0204 chip (having a cancellation loop width of 0.51 mm). Data points 36, 38 and 40 respectively correspond to the measured values for 0306, 0508 and 0612 chips (having respective cancellation loop widths of about 0.76 mm, 1.27 mm and 1.52 mm).

Figure 4:
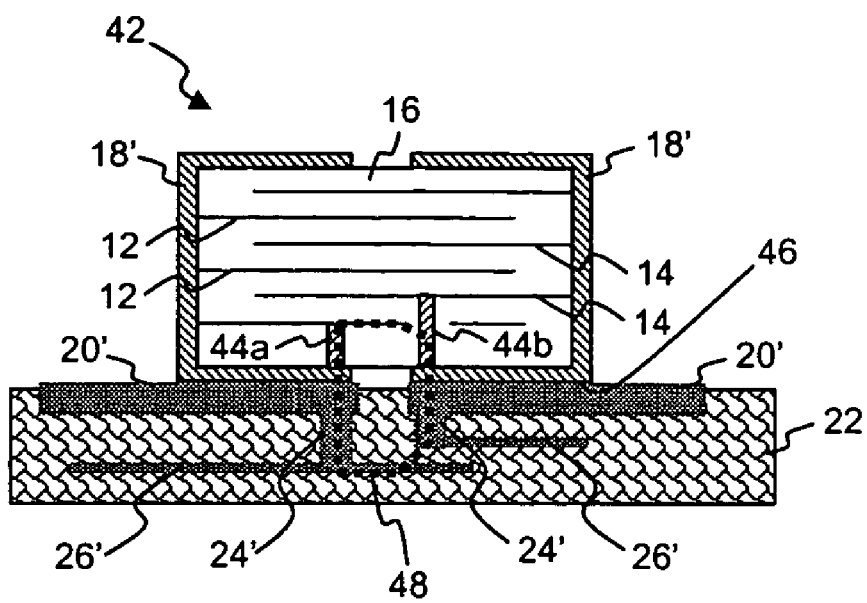
FIG. 4 depicts aspects of a current loop for an exemplary horizontal electrode capacitor embodiment in accordance with the presently disclosed technology.

Different embodiments in accordance with aspects of the present subject matter will now be discussed with respect to their reduction of the current carrying loop area. FIG. 4 depicts a capacitor embodiment 42 that includes many similar features of capacitor 10' as illustrated in FIG. 2. Like reference numerals are employed to indicate such features. A plurality of first electrodes 12 and second electrodes 14 are alternately stacked in an interleaved arrangement with a plurality of dielectric layers 16 to form a multilayered arrangement characterized by top and bottom surfaces, one of which will be considered for descriptive purposes to be a mounting surface (indicated by reference numeral 46). First and second conductive vias 44a and 44b are formed through the mounting surface of capacitor 42, by such exemplary means as utilizing laser ablation to form openings in the device followed by a step of plating conductive material in the openings. A first conductive via 44a is formed through the dielectric cover layer provided relative to mounting surface 46 such that via 44a is provided in direct contact with the bottommost first electrode 12 closest to mounting surface 46. Conductive via 44b is formed through the same dielectric cover layer and through an opening formed within bottommost first electrode 12 until via 44b is in direct contact with the bottommost second electrode 14. Terminations 18' are then formed along the device periphery such that one termination electrically connects each first electrode 12 and conductive via 44a and one termination electrically connects each second electrode 14 and conductive via 44b. Terminations 18' also provide lands for mounting capacitor 42 to solder pads 20' on circuit board 22. Vias 44a and 44b are generally spaced from one another at a distance that is substantially equal to the gap between termination lands 18'. This distance may also correspond to the gap between solder pads 20' and the distance between circuit board vias 24'. As illustrated in FIG. 4, current loop 48 associated with capacitor embodiment 42 mounted to circuit board 22 defines a much smaller area than either of the prior art capacitor embodiments in FIGS. 1 and 2.

Figure 5:
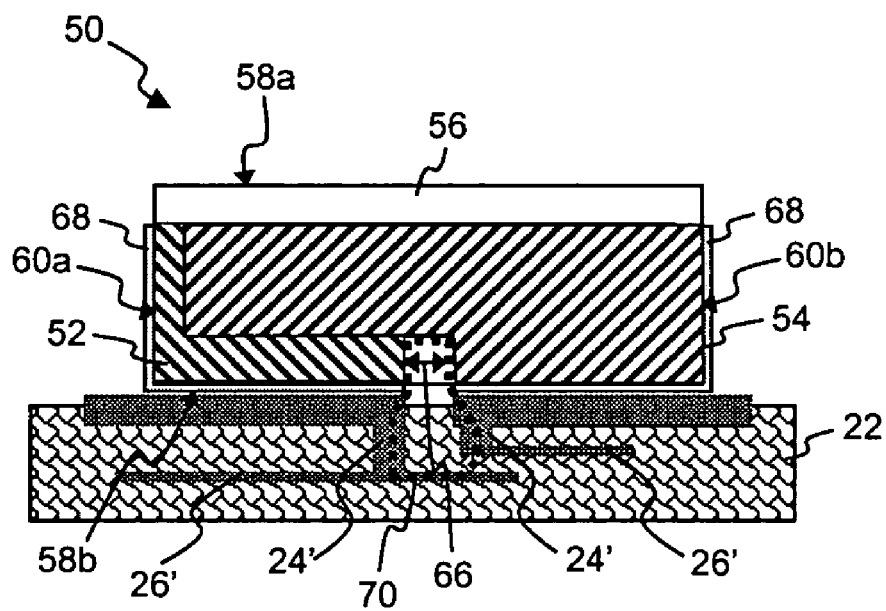
FIG. 5 depicts aspects of a current loop for an exemplary vertical electrode capacitor embodiment in accordance with the presently disclosed technology.

Referring now to another embodiment of the presently disclosed technology, FIG. 5 depicts an exemplary capacitor embodiment 50 that includes a plurality of first electrodes 52 and second electrodes 54 alternately stacked with a plurality of dielectric layers. Each first electrode 52 is paired with one of second electrodes 54 to form opposing capacitor plates. FIG. 5 illustrates one first electrode 52 and one second electrode 54 superimposed on top of one another, but a plan view of such electrodes isolated from one another can be seen in FIGS. 11A and 11B.

Figure 32:
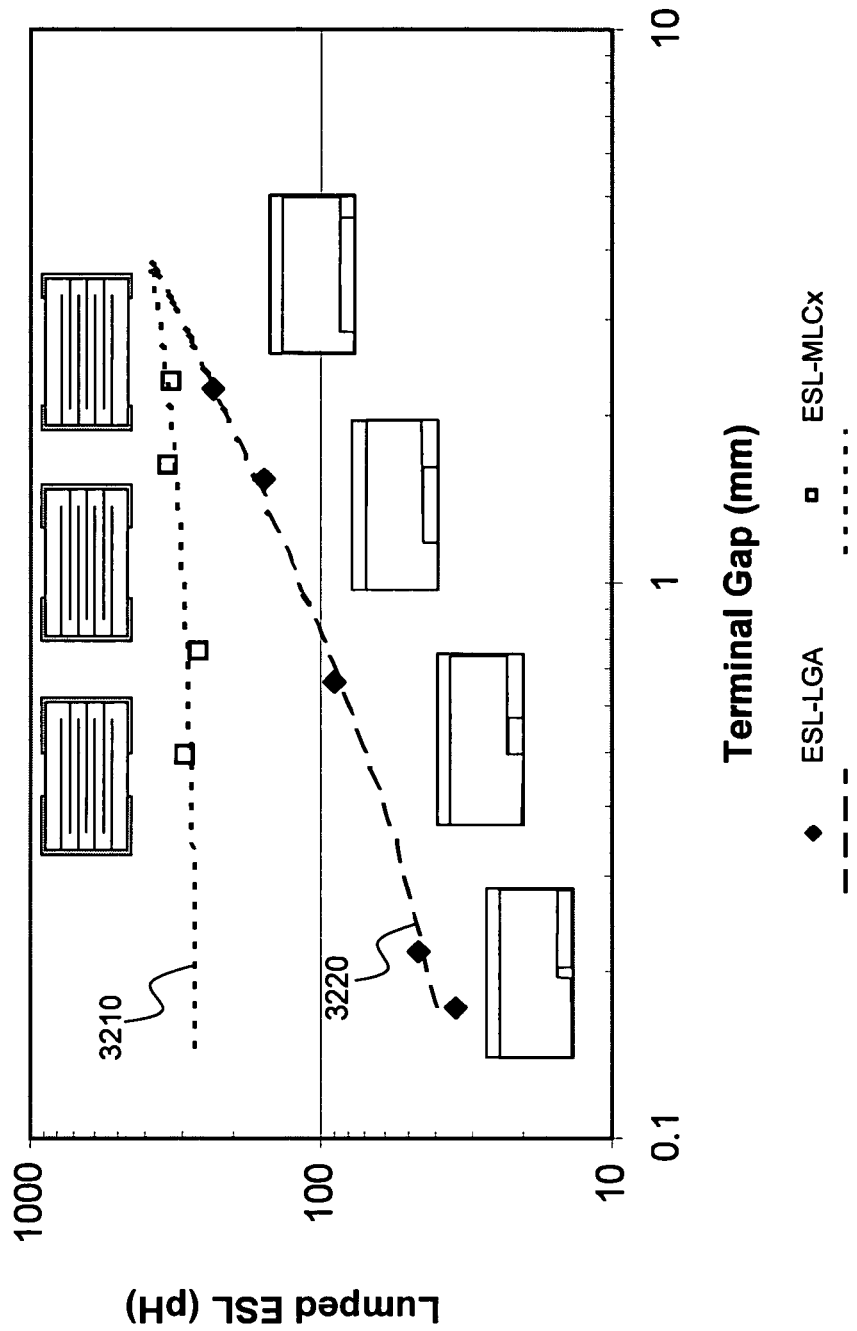
FIG. 32 provides a graphical comparison of general inductance trends for low inductance MLCC components especially depicting lumped ESL values versus cancellation loop width for multiple exemplary LGA capacitor embodiments of differing sizes in accordance with the present technology.

FIG. 32 provides a graphical comparison of general inductance trends for low inductance MLCC components represented by data line 3210, especially depicting lumped ESL values versus cancellation loop width for multiple exemplary LGA capacitor embodiments of differing sizes in accordance with the present technology as represented by data line 3220 on the graph. Data line 3210 represents that ESL is essentially constant between about 300-350 µF for conventional 1206 multilayer capacitors as, for example, illustrated in Prior Art FIGS. 1 and 2 regardless of spacing between terminals. In accordance with the present technology, however, an LGA configuration as represented, for example, in FIG. 5 constructed in accordance with the present subject matter, shows significant decrease in ESL as spacing between the terminals and associated internal tabs leading to the terminals decreases. Such decrease in ESL is illustrated by data line 3220.

Figure 33:
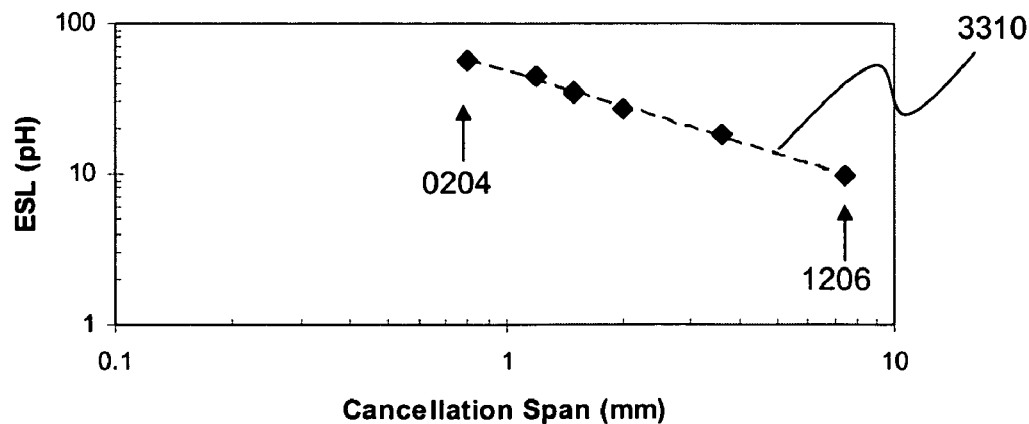
FIG. 33 graphically illustrates measured ESL versus cancellation span for a series of exemplary LGA components with constant terminal gap spacing.
Figure 34:
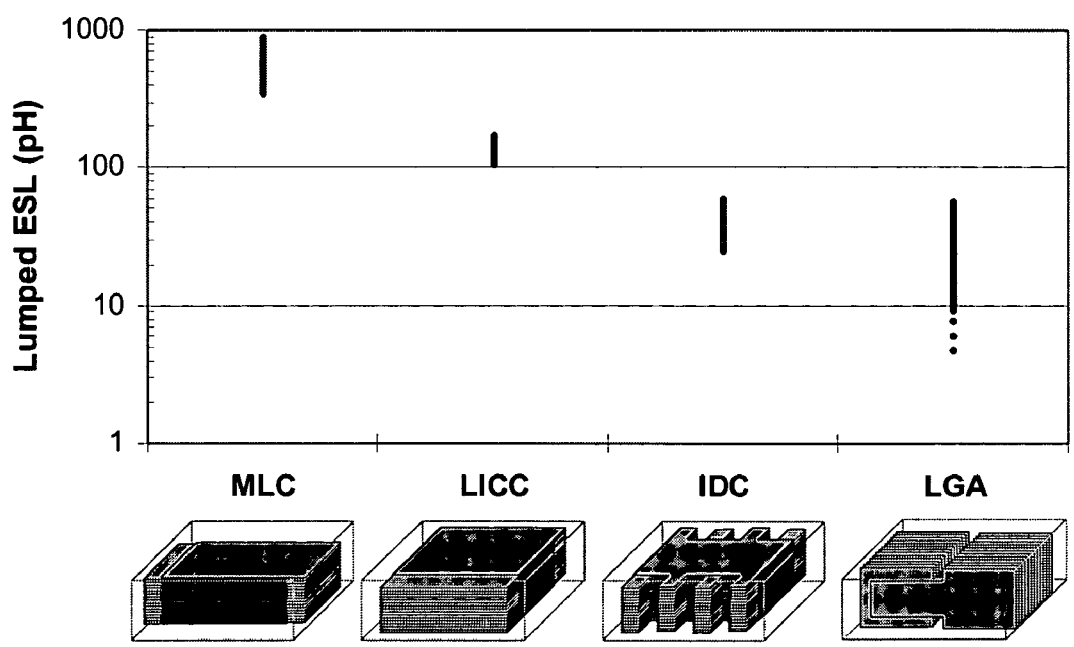
FIG. 34 graphically illustrates lumped ESL versus various prior capacitor structures in comparison to that of the present subject matter.

FIG. 33 further graphically illustrates measured ESL versus cancellation span for a series of LGA components with constant terminal gap spacing. Data line 3310 illustrates that ESL for LGA capacitors constructed in accordance with the present subject matter can be reduced by increasing the total span of the cancellation loop, that is, the direction of the terminal perpendicular to current flow. FIG. 33 graphically represents measured ESL for a number of part styles ranging from "0204" to "1206" and illustrating change in ESL while maintaining constant terminal gap spacing. FIG. 34 graphically illustrates lumped ESL versus various prior capacitor structures in comparison to that of the present subject matter. In particular, an LGA device constructed in accordance with the present subject matter may exhibit significantly less lumped equivalent series inductance (ESL) than previously employed and known configurations.

FIG. 11A illustrates an exemplary first electrode 52 provided on a sheet of dielectric material 56, while FIG. 11B illustrates an exemplary second electrode 54 provided on a sheet of dielectric material 56. Electrodes 52 and 54 are generally L-shaped and are characterized by respective main portions 62a, 62b and extended portions, or tab portions, 64a, 64b. Exemplary materials for electrode layers 52 and 54 include platinum, nickel, copper, a palladium-silver alloy, or other suitable conductive substances. Dielectric material 56 may comprise barium titanate, zinc oxide, alumina with low-fire glass, or other suitable ceramic or glass-bonded materials. Alternatively, the dielectric may be an organic compound such as an epoxy (with or without ceramic mixed in, with or without fiberglass), popular as circuit board materials, or other plastics common as dielectrics. In some embodiments of the present technology, the dielectric sheets and selectively interleaved electrodes may be stacked and sintered together before the application of external (or peripheral) terminations. In other embodiments, previously sintered dielectric sheets may be used. In still further embodiments, a laminated component may be formed by alternately printing and drying layers of insulating paste (for the dielectric layers) and conductive paste (for the electrode layers). Other methods of forming multilayer electronic devices as are known to those skilled in the art may also be employed in accordance with the spirit and scope of the present subject matter.

Referring back to FIG. 5, first electrodes 52, second electrodes 54, and dielectric layers 56 are selectively interleaved to form a stacked arrangement characterized by respective top and bottom surfaces and four side surfaces. Top and bottom surfaces generally correspond to one or more dielectric layers 56. Side surfaces of capacitor 50 include two longer side surfaces 58a and 58b and two shorter side surfaces 60a and 60b. The orientation of capacitor 50 of FIG. 5 is different than the capacitors illustrated in FIGS. 1, 2 and 4 in that the mounting surface is not one of the top and bottom surfaces of the multilayered stack. The surface of capacitor 50 mounted to circuit board 22 corresponds to one of its side surfaces (namely, side surface 58b in FIG. 5) such that the electrodes in such capacitor are configured for orientation relative to circuit board 22 (or other desired mounting location) in a generally perpendicular aspect. Such a mounting orientation results in what can be referred to as "vertical" electrodes, as opposed to what would correspondingly be referred to as "horizontal" electrodes in capacitors 10, 10' and 42 of FIGS. 1, 2 and 4, respectively.

Referring still to FIGS. 5, 11A and 11B, each first electrode 52 is positioned in the multilayered stack such that the tab portion 64a extends to and is exposed on (before subsequent application of peripheral terminations) side 58b which is configured for adjacent positioning relative to a circuit board, separate component, or other mounting location. Additional respective portions of tab portion 64a and main electrode portion 62a extend to and are exposed on a given side 60a of the capacitive device. In similar fashion, each second electrode 54 is positioned in the multilayered stack such that tab portion 64b extends to side 58b of capacitor 50. Additional respective portions of tab portion 64b as well as main electrode portion 62b extend to a capacitor side surface adjacent to mounting surface 58b, namely side 60b. The location of exposure of each portion of electrodes 52 and electrodes 54 along the periphery of the multilayer capacitor defines where terminations 68 will be formed.

In accordance with one exemplary embodiment of the present subject matter terminations 68 may be formed with a plating process as described in U.S. patent application Ser. No. 10/409,023 entitled "Plated Terminations, an application that is assigned to the assignee of the preset application, AVX Corporation, and which is incorporated herein by reference for all purposes. See United States Patent Application Publication No. 20030231457 of Dec. 18, 2003, the electronic published version of such application, and which is incorporated herein by reference for all purposes. In accordance with such plating technology, terminations 68 correspond to a thin-film plating material, for example, such as but not limited to copper. Such plating material may be formed in accordance with a process, as disclosed more particularly in the above-referenced pending application, in which the pre-terminated stacked arrangement of dielectric layers 56, first electrodes 52 and second electrodes 54 is fully immersed in an electroless plating solution such as a nickel or copper ionic solution. Capacitor 50 (or multiple such capacitors as may more typically be the case in a batch termination process) are exposed to the electroless plating solution for some predetermined amount of time (e.g., 15 minutes) until plating material deposits at the exposed portions of electrodes 52 and 54 and forms bridged connections among adjacent electrodes of the same polarity. Since the location of exposure of electrodes 52 and 54 determines where the plating solution will be deposited, terminations 68 are in effect "self-determining" as to their location of formation, and are thus guaranteed to correspond precisely with the exposure location of the electrodes 52 and 54. In such manner, the gap 66 between respective tab portions 64a and 64b of electrodes 52 and 54 defines the same gap that will exist along the mounting surface 58b between the two respective terminations 68.

It should be appreciated in accordance with the above-described embodiment of terminations 68, that such terminations may sometimes be formed with different techniques such as by way of an evaporation or sputtering process. Terminations 68 may also be formed by applying metallization to the periphery of capacitor 50 and then patterning the metallization in desired locations, such as may be done by way of laser etching, photo-lithographic methods, or a similar technique. It should be further appreciated that terminations 68 may include a single layer of metallization (such as the thin-film plating layer described above) or may include additional layers formed thereon. One example of a multilayered termination that may be employed corresponds to an initial layer of plated Copper (Cu), on top of which a layer of Nickel (Ni) then a layer of Tin (Sn) are provided.

The nature of the plated terminations 68 as well as the placement of electrodes 52 and 54 enable the gap 66 in capacitor 50 of FIG. 5 to be even less than the gap between conductive vias 44a and 44b of capacitor 42 of FIG. 4. As a result, the current carrying loop 70 and the resultant area defined by such loop is even smaller than that of the other capacitor embodiments presented thus far. The spacing of the termination and electrode gap 66 in some embodiments may be between about 100 and 400 microns. In one particular embodiment, gap 66 will be about 250 microns in length.

In general, the closer the spacing between terminations 68 (i.e., the smaller the gap 66), the lower the component inductance. However, there are certain limitations as to how small gap 66 can be. If the disclosed electroless plating techniques are used to form terminations 68, then gap 66 must be at least large enough to avoid a risk of too much plating material forming on the device periphery such that the respective terminations 68 bridge together, thus shorting together electrodes of opposing polarity. Furthermore, capacitor 50 may preferably be mounted to (eq., soldered to) circuit board pads 20'. No solder balls such as utilized in Ball Grid Array (BGA) attachment schemes are required. This type of attachment may be referred to as a Land Grid Array (LGA) technique. The limitations of such reflow solder mounting technology may also contribute to the minimum feasible distance for gap 66. As long as gap 66 is not so small as to impose a risk of the opposite polarity terminations 68 or the opposite polarity solder pads 20' shorting together, then gap size 66 is effectively acceptable per the present disclosure. It should also be appreciated that gap 66 may always feasibly be wider than the above-mentioned maximum of about 400 microns, but the wider the gap 66, the lower the reduction in overall device ESL. It should be further appreciated that a shorter current path and larger terminated area afforded by terminations 68 also gives very low device ESR.

The capacitor embodiment 50, discussed in part with reference to FIGS. 5, 11A and 11B, illustrates only one example of vertically oriented electrodes in accordance with the present subject matter. Many different or alternative electrode configurations for orientation perpendicular to a mounting surface may also be utilized, several examples of which will now be discussed.

Figure 6:
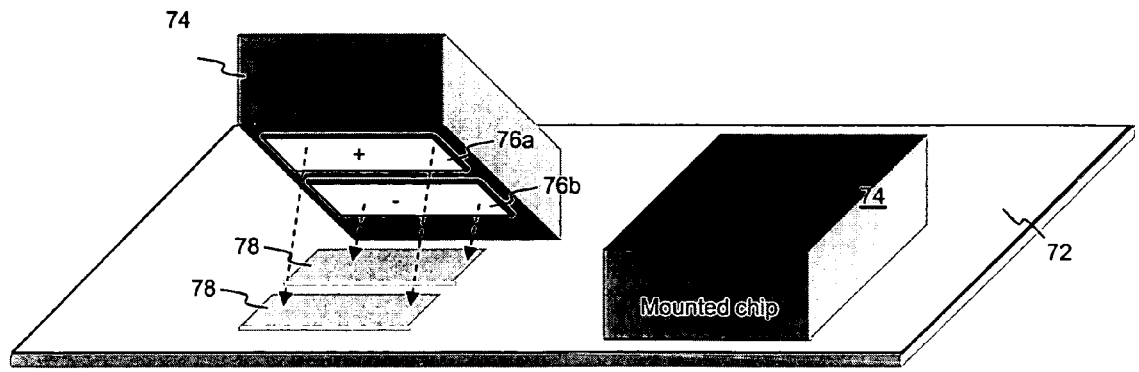
FIG. 6 provides a generally perspective view of a mounting substrate and exemplary capacitor embodiment in accordance with the present subject matter in respective positions before and after mounting the component.

FIGS. 6 and 7A through 7D, respectively, provide generally perspective views of exemplary vertical electrode capacitor arrangements in accordance with the presently disclosed technology. Such figures in pertinent part are intended to provide a perspective of the capacitor surface that will be employed as a mounting surface for attachment to a circuit board or other substrate, such as substrate 72 of FIG. 6. In FIG. 6, respective termination lands 76a and 76b are aligned with exemplary pads 78 on such representative substrate 72. Solder paste is applied to pads 78, the capacitor chip 74 is placed, and the part is reflowed, resulting in a mounted chip 74 as depicted on the right side of FIG. 6.

As previously mentioned, the mounting surface of a capacitor is generally one of the longer (or wider) side surfaces of a multilayered stacked assembly. For example, referring to FIG. 7B (which is a similar capacitor to embodiment 50 illustrated in FIG. 5), side surface 58b is considered the mounting surface. Side surfaces 60a and its opposing surface 60b are adjacent to mounting surface 58b. The other two surfaces are the respective top and bottom surfaces of the stacked assembly.

Figure 7A:
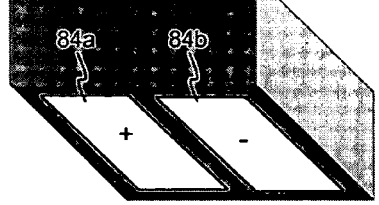
FIG. 7A provides a generally perspective view of an exemplary capacitor embodiment in accordance with aspects of the presently disclosed technology having two wide-exposure mounting terminals.
Figure 7B:
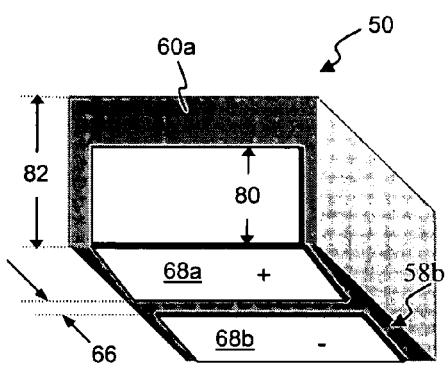
FIG. 7B provides a generally perspective view of an exemplary capacitor embodiment in accordance with aspects of the presently disclosed technology having two mounting terminals with lands extending from a mounting surface to adjacent side surfaces of the capacitor.

In FIG. 7B, the gap 66 between termination 68a (a positive termination, denoted by a "+" symbol) and termination 68b (a negative termination, denoted by a "−" symbol) may be between about 100-400 microns in some embodiments, and between about 200-300 microns in other embodiments.

The distance 80 of portions of terminations 68a and 68b that extend from surface 58b in a continuous fashion up adjacent opposing side surfaces 60a and 60b may vary. In some embodiments, distance 80 may be relatively shorter, thus facilitating the formation of a solder fillet upon mounting capacitor 50 to a circuit board. Distance 80, in some preferred embodiments, may correspond to just over half of the dimension 82 of side surface 60a, to facilitate electrical testing of capacitor 50. In still further present embodiments, distance 80 may be just less than or even substantially equal to dimension 82.

Although not illustrated, it should be appreciated that terminations 68a and 68b may in other embodiments extend from mounting surface 58b to the other opposing sides (what have been referred to herein as the top and bottom surfaces of the device).

Referring now to exemplary FIG. 7A, it should be appreciated that the internal electrodes of a capacitor in accordance with the present subject matter may be stacked in a different dimension such that the first and second terminations 84a and 84b, respectively, are formed in a direction that is offset ninety degrees from the terminations in capacitor 50 of exemplary FIG. 7B.

Figure 7C:
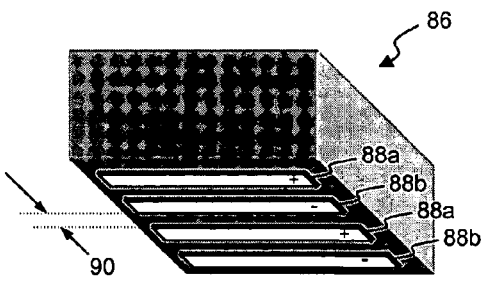
FIG. 7C provides a generally perspective view of an exemplary capacitor embodiment in accordance with aspects of the presently disclosed technology having four mounting terminals.
Figure 7D:
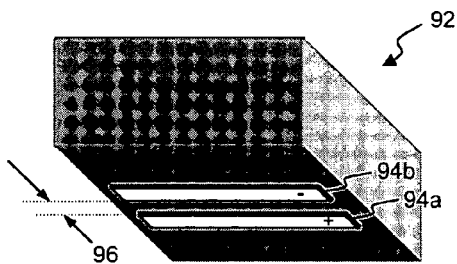
FIG. 7D provides a generally perspective view of an exemplary capacitor embodiment in accordance with aspects of the presently disclosed technology having two narrow-exposure mounting terminals.

Still further alternative electrode designs may be utilized to form the respective present exemplary capacitors of FIGS. 7C and 7D.

In representative capacitor 86 of FIG. 7C, each positive electrode would include two tab portions that extend to the mounting surface of capacitor 86, and each negative electrode would include two tab portions that extend to different locations of the capacitor's mounting surface. When a plurality of the first and second electrodes are stacked in an interleaved arrangement with alternating dielectric layers, the tab portions of positive (+) polarity are aligned in two respective columns and the tab portions of negative (−) polarity are aligned in two different but adjacent columns. Terminations 88a are provided to connect positive polarity tab portions in given columns together, while terminations 88b are provided to connect together negative polarity tab portions in given columns. The distance 90 between the innermost terminations 88a and 88b controls in part the overall ESL value and such gap may preferably correspond to the distance of gap 66 in FIGS. 5 and 7B.

Representative capacitor 92 of FIG. 7D is similar to capacitor 86 of FIG. 7C except that only one tab from each first and second electrode extends to the capacitor mounting surface such that a single positive termination 94a and a single negative termination 94b are formed on the capacitor periphery.

The representative gap 96 between such terminations 94a and 94b is in these exemplary embodiments preferably about the same as exemplary gap 90 of FIG. 7C.

It should be appreciated with respect to each of the exemplary capacitor embodiments illustrated in FIGS. 6 and 7A-7D, respectively, that the capacitor chips could be symmetric on top and bottom. In other words, the electrode exposure locations and corresponding terminations formed on each of the capacitor mounting surfaces would be respectively mirrored on the side surfaces respectively opposite each such respective mounting surface.

Figures 8A, 8B:
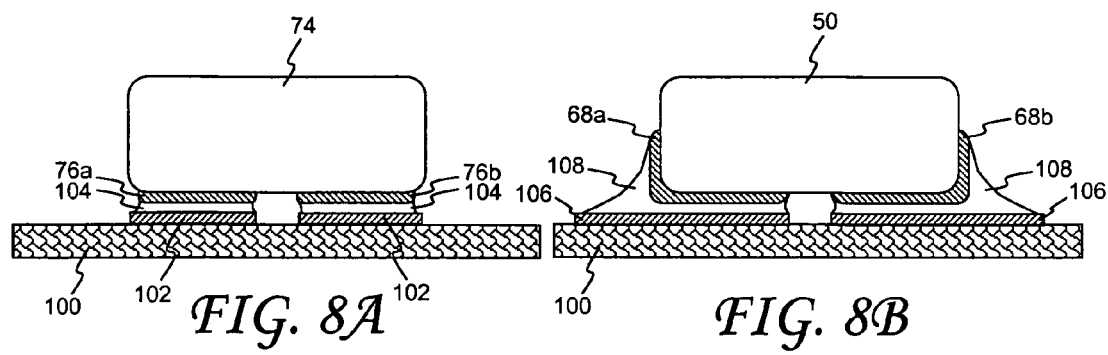
FIGS. 8A and 8B respectively illustrate aspects of soldering exemplary capacitor embodiments in accordance with the present subject matter relative to a mounting substrate.

Referring now to FIGS. 8A and 8B, an illustration is presented of different solder joints between an exemplary capacitor embodiment of the present subject matter and a circuit board. FIG. 8A shows a capacitor similar to exemplary capacitor 74 of FIG. 6 after being mounted to a substrate 100. Respective terminations 76a and 76b are applied to circuit board pads 102 when portions of solder 104 are applied to pads 102 and reflowed. With reference to FIG. 8A, it should be noted that the size of pads 102 may be limited to make capacitor 74 self-centering after reflowing the solder 104.

Exemplary FIG. 8B depicts an exemplary capacitor embodiment similar to exemplary capacitor 50 of FIGS. 5 and 7B, having respective terminations 68a and 68b that wrap in a continuous fashion from the capacitor mounting surface to adjacent side surfaces of the device. Having such extended terminations facilitates the formation of more robust solder joints 108 when such solder is reflowed to circuit board pads 106.

Figure 9A:
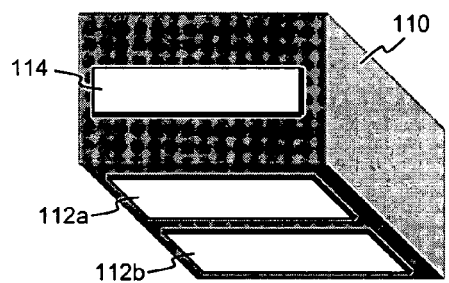
FIG. 9A provides a generally perspective view of an exemplary capacitor embodiment in accordance with aspects of the presently disclosed technology having two mounting terminals and narrow-exposure side terminals.
Figure 9B:
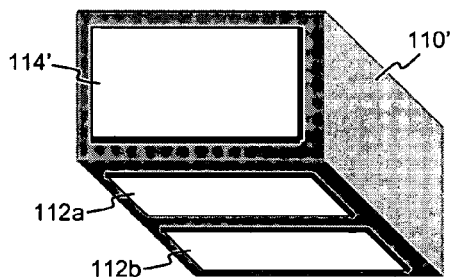
FIG. 9B provides a generally perspective view of an exemplary capacitor embodiment in accordance with aspects of the presently disclosed technology having two mounting terminals and wide-exposure side terminals.

Now referring to FIGS. 9A and 9B, it should be appreciated that certain exemplary capacitors in accordance with aspects of the present technology may be formed with side terminals that are not continuous with the terminations on the capacitor mounting surface. For example, exemplary respective capacitors 110 and 110' of FIGS. 9A and 9B include respective bottom terminations 112a and 112b as well as separate, respective side terminations 114 and 114'. Respective first and second electrodes in such exemplary capacitors would have additional tab portions extending to respective side surfaces of the device to form terminations 114 and 114'. A larger tab exposure area would result in larger side terminations such as 114' of FIG. 9B, although smaller terminations such as 114 of FIG. 9A would still provide accessible electrical connections to facilitate device testing. It is not desirable for side terminals (or end terminals) 114 and 114' to wet with the solder during mounting of capacitors 110 and 110' to a substrate.

Figure 10:
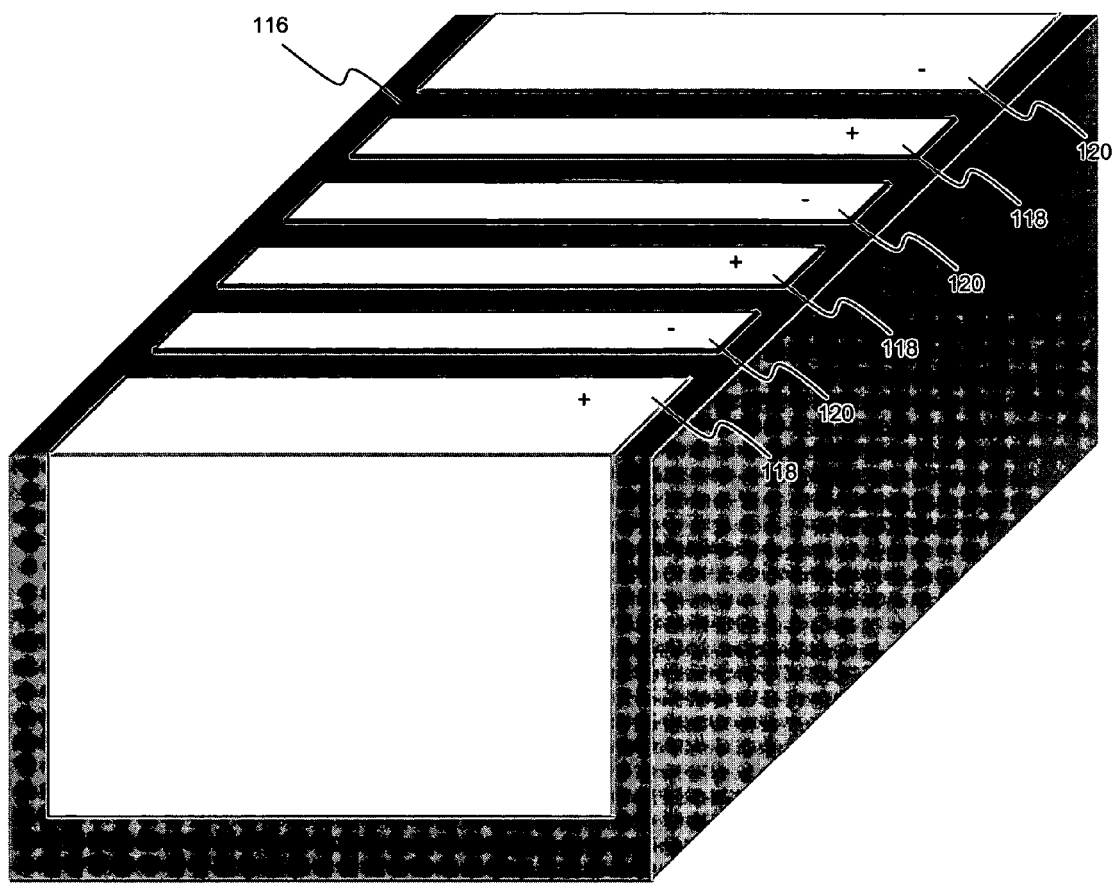
FIG. 10 provides an inverted perspective view of an exemplary capacitor embodiment in accordance with aspects of the present subject matter having six mounting terminals.

FIG. 10 represents another exemplary capacitor embodiment generally 116 in accordance with aspects of the present technology. Such exemplary capacitor 116 is a bottom-terminated land grid array capacitor with six termination lands, which includes three positive lands 118 and three negative lands 120. The perspective view of FIG. 10 shows the mounting surface of capacitor 116. The pitch (i.e., separation) between adjacent lands 118 and 120 may be about the same as previously described with respect to other exemplary embodiments, namely between about 100 and 400 microns. Outermost termination lands may extend to and wrap over to adjacent side surfaces of capacitor 116 (as represented, but without additional reference characters) to provide locations for electrical testing of the device.

Additional alternative electrode configurations for use in capacitor embodiments of the present technology will now be presented. Such exemplary electrode configurations will generally be illustrated as a single first electrode on top of a dielectric sheet and a single second electrode on top of another dielectric sheet. It should be appreciated that multiple of such first and second representative electrodes and their respective representative dielectric sheets as well as additional sheets of dielectric material may be selectively stacked together to form an intermediate, unterminated aspect of the subject capacitor embodiments. In certain additional exemplary embodiments, conductive anchor tabs may be included with both electrodes layers and dielectric sheet layers for termination purposes as will be discussed later with respect to FIGS. 27-31.

FIGS. 12A and 12B provide respective plan views of an exemplary first electrode 122a and an exemplary second electrode 122b on top of respective dielectric sheets 56. Each electrode 122a and 122b includes as illustrated a respective main portion 124a and 124b and respective pairs of extended tab portions 126a, 128a and 126b, 128b. When provided in an interleaved stack of device layers, each tab portion 126a, 126b, 128a and 128b will extend to a mounting surface of the device. Tab portions 128a and 128b also extend to a side surface adjacent to the mounting surface. As will be understood from the illustration, tab 128a extends to a surface opposite the one to which tab 128b extends.

Figure 13A:
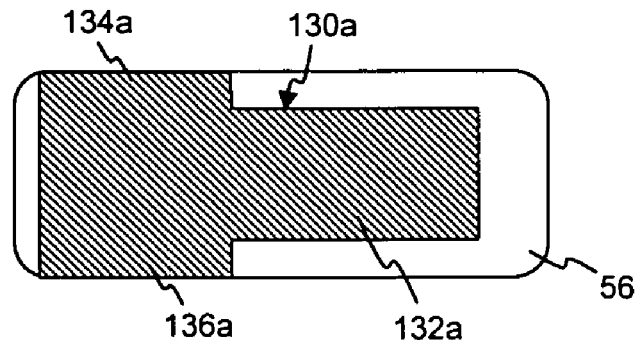
FIGS. 13A and 13B provide plan views of a third example of respective first and second polarity electrodes for use in a capacitor embodiment of the present technology.
Figure 13B:
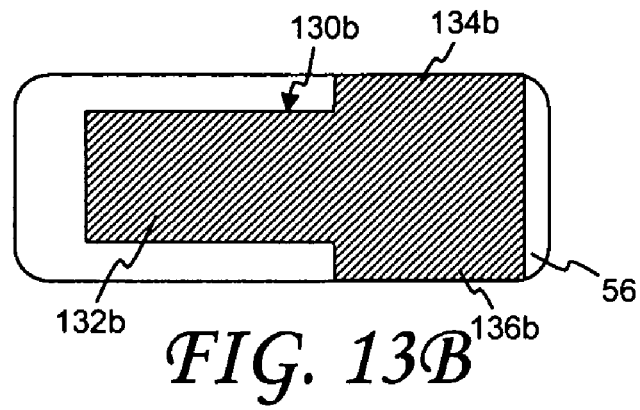
Figure 13C:
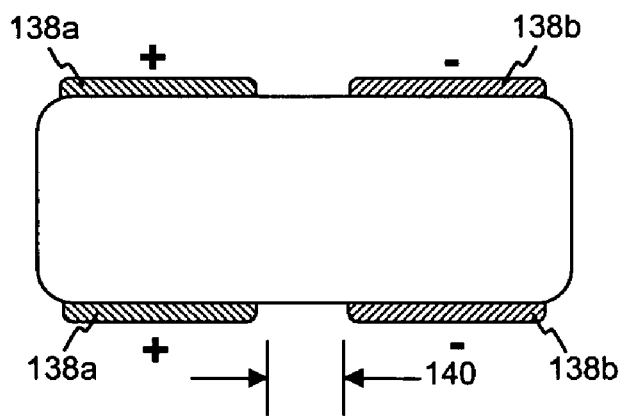
FIG. 13C provides a side view of a terminated capacitor incorporating the exemplary electrodes of FIGS. 13A and 13B.

FIGS. 13A and 13B provide respective plan views of an exemplary first electrode 130a and an exemplary second electrode 130b provided on top of respective dielectric sheets 56. Each electrode 130a and 130b includes a respective main portion 132a and 132b and respective paired tab portions 134a, 136a and 134b, 136b. When provided in an interleaved stack of device layers, tabs 134a and 136a will extend to and be exposed on opposite side surfaces (one or more of which will be a device mounting surface), where positive terminations 138a as illustrated in FIG. 13C may be formed. Similarly, tab portions 134b and 136b will extend to different locations on the same opposing side surfaces where negative terminations 138b may be formed. The resultant gap 140 between adjacent first and second polarity terminations on a mounting surface may be within a range from about 100-400 microns, as previously discussed.

It should be appreciated in FIGS. 13A-13C and in most of the remainder of the figures discussed, that electrodes and corresponding terminations of a first polarity (generally indicated as a positive (+) polarity) are denoted by cross-hatched shading slanting downward from left to right (for example, as in FIG. 13A). Electrodes and corresponding terminations of a second opposite polarity (generally indicated as a negative (−) polarity) are denoted by cross-hatched shading slanting upward from left to right (for example, as in FIG. 13B). In those instances where polarity may not be an issue, electrodes may be alternated designated with lighter and heavier cross hatching to designate different electrode sequences or layers.

Figure 14A:
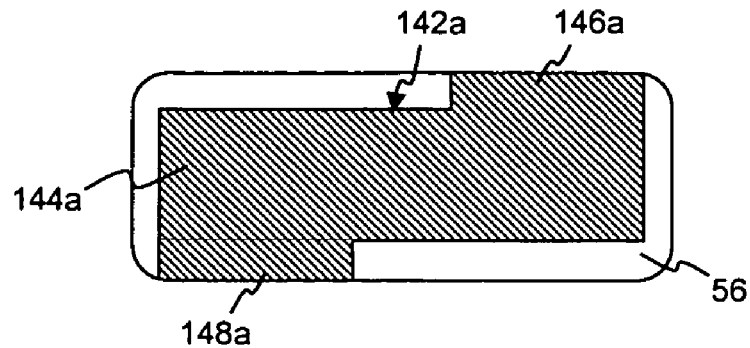
FIGS. 14A and 14B provide plan views of a fourth example of respective first and second polarity electrodes for use in a capacitor embodiment of the present technology.
Figure 14B:
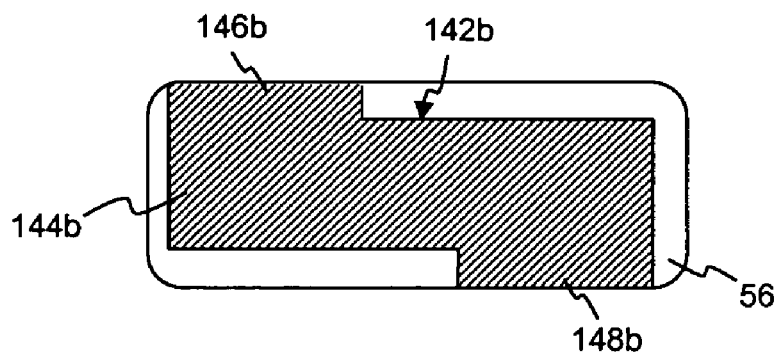
Figure 14C:
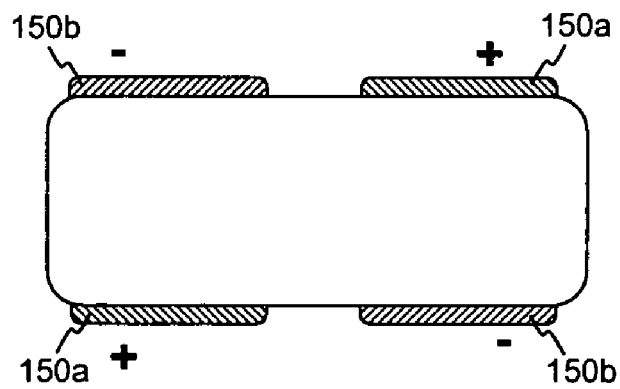
FIG. 14C provides a side view of a terminated capacitor incorporating the exemplary electrodes of FIGS. 14A and 14B.

FIGS. 14A and 14B provide respective plan views of an exemplary first electrode 142a and an exemplary second electrode 142b provided on top of respective dielectric sheets 56. Each electrode 142a and 142b includes a respective main portion 144a and 144b and respective paired tab portions 146a, 148a and 146b, 148b. The location of exposure of positive tab portions 146a on a device surface is opposite the location of exposure of negative tab portions 148b, while positive tab portions 148a are generally opposite negative tab portions 146b, such that opposing terminations 150a and 150b (such as illustrated in FIG. 14C) may be formed in accordance with present subject matter on a mounting surface and its respective opposing surface.

Figure 15A:
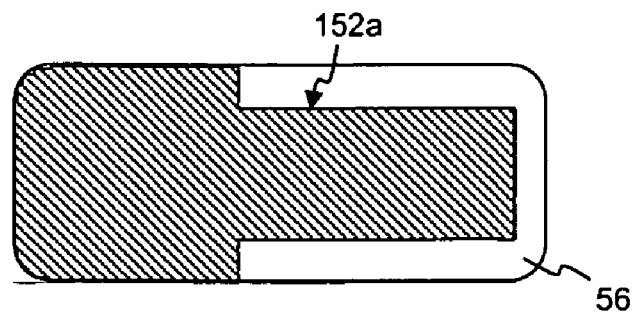
FIGS. 15A and 15B provide plan views of a fifth example of respective first and second polarity electrodes for use in a capacitor embodiment of the present technology.
Figure 15B:
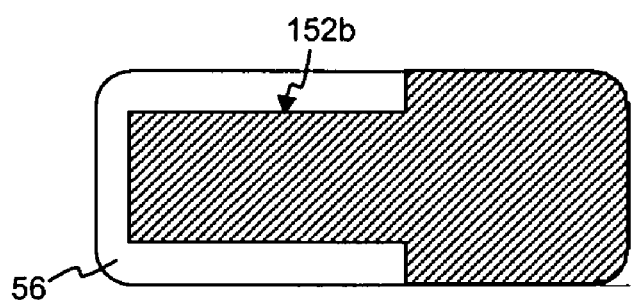
Figure 15C:
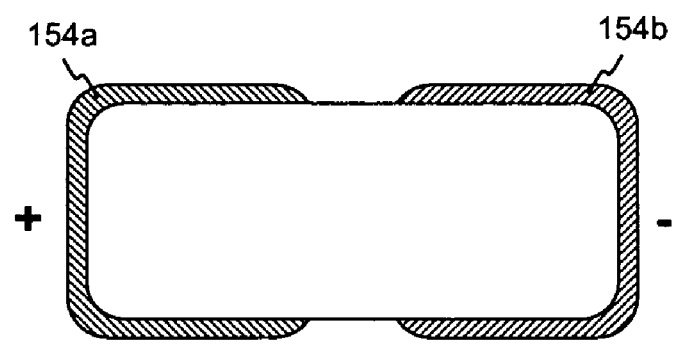
FIG. 15C provides a side view of a terminated capacitor incorporating the exemplary electrodes of FIGS. 15A and 15B.

FIGS. 15A through 15C depict aspects of a capacitor having generally U-shaped lands. In such a device, a first (positive) electrode 152a (FIG. 15A) is provided in the center of a dielectric sheet 56, but has portions thereof that extend to a given mounting surface and are exposed continuously from the given mounting surface along an adjacent side surface and to the surface opposite the mounting surface. Second (negative) electrode 152b (FIG. 15B) is formed in similar arrangement, but inverted. Such exemplary electrodes 152a and 152b would result in the formation of respective generally U-shaped termination lands 154a and 154b, in accordance with present subject matter (see FIG. 15C).

Figure 16A:
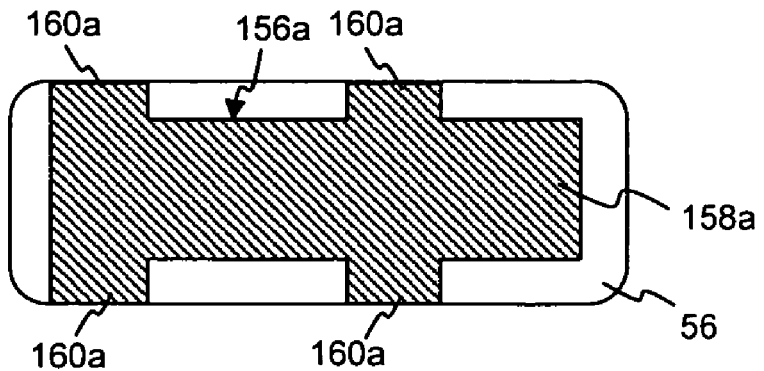
FIGS. 16A and 16B provide plan views of a sixth example of respective first and second polarity electrodes for use in a capacitor embodiment of the present technology.
Figure 16B:
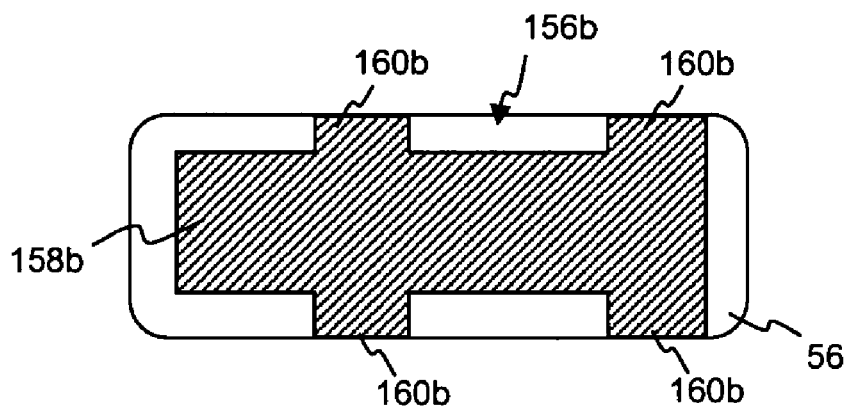
Figure 16C:
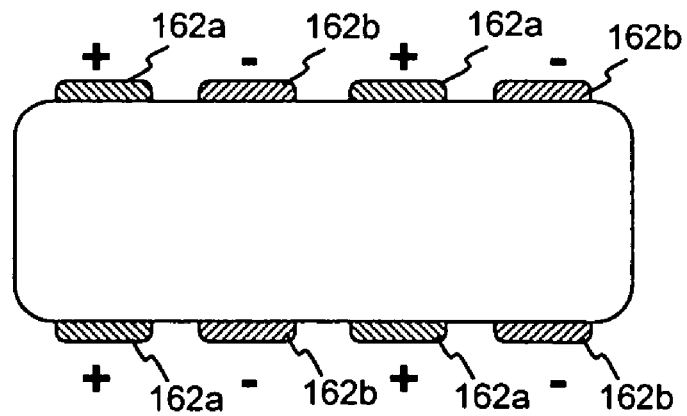
FIG. 16C provides a side view of a terminated capacitor incorporating the exemplary electrodes of FIGS. 16A and 16B.

FIGS. 16A through 16C depict aspects of another exemplary capacitor embodiment, with a plurality of first electrodes 156a and a plurality of second electrodes 156b stacked with a plurality of dielectric sheets 56 in an interleaved fashion to form a multilayer capacitor. Each first electrode 156a (FIG. 16A) and each second electrode 156b (FIG. 16B) includes a respective main portion 158a, 158b and a plurality of respective tab portions 160a, 160b. Tab portions 160a of first exemplary electrode 156a extend in pairs at opposing sides of main portion 158a. Two tab portions 160a will extend to a mounting surface and the other two tab portions will extend to parallel locations on the surface opposite such mounting surface. Two tab portions 160a are substantially flush with a shorter side of main portion 158a. Second electrode 156b is formed in a similar but inverted fashion to first electrode 156a. The respective tab portions 160a and 160b of the first and second electrodes are located such that they do not overlap with one another. When multiple such first and second electrodes are stacked together with a plurality of dielectric layers, tab portions will be exposed in respective columns such that, in accordance with present subject matter, positive terminations 162a and negative terminations 162b may be formed on the device periphery, as illustrated in FIG. 16C.

Figure 17A:
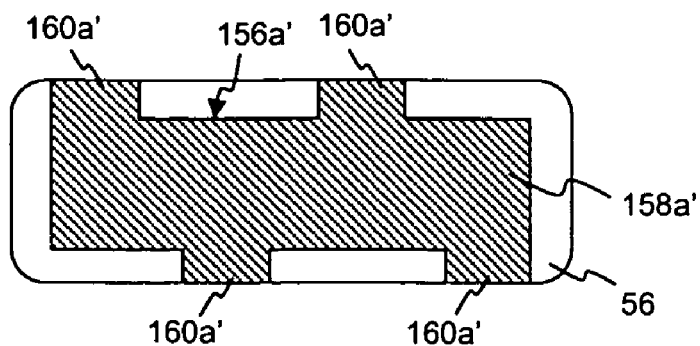
FIGS. 17A and 17B provide plan views of a seventh example of respective first and second polarity electrodes for use in a capacitor embodiment of the present technology.
Figure 17B:
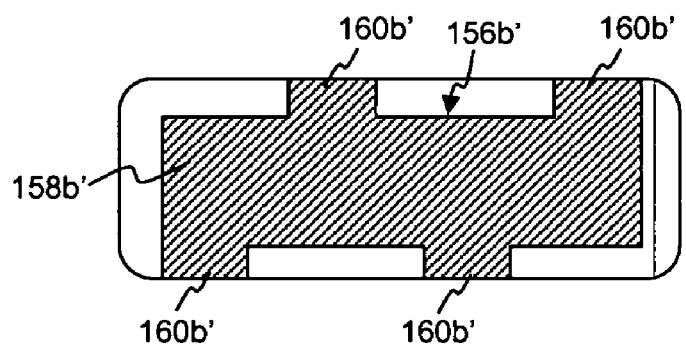
Figure 17C:
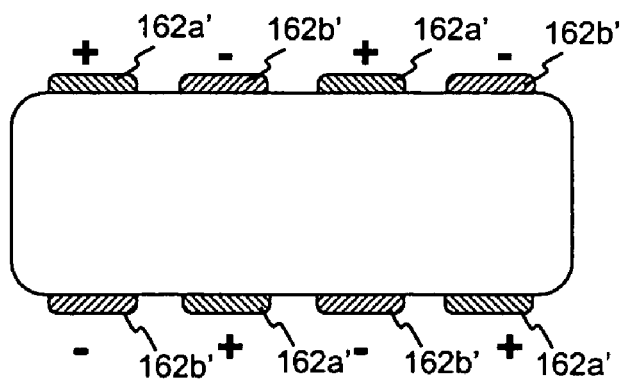
FIG. 17C provides a side view of a terminated capacitor incorporating the exemplary electrodes of FIGS. 17A and 17B.

FIGS. 17A through 17C, respectively, represent exemplary electrode and resultant capacitor embodiments similar to those illustrated in FIGS. 16A through 16C. However, tab portions 160a' (FIG. 17A) of exemplary first electrode 156a' extend from main portion 158a' in alternating locations. One of tabs 160a' extends from a given longer side of main portions 158a' such that a side of such tab portion is flush with the shorter side of main portion 158a' adjacent to a given longer side. Another of tabs 160a' extends from the longer side of main portion 158a' opposite that of the "given longer side" such that a portion of such other tab is substantially flush with the other shorter side of main portion 158a'. Exemplary second electrode 156b' (FIG. 17B) is formed in a similar but inverted fashion to first electrode 156a'. When multiple such first and second electrodes are stacked together with a plurality of dielectric layers, tab portions will be exposed in respective columns such that positive terminations 162a' and negative terminations 162b' may be formed on the device periphery in accordance with present subject matter, as illustrated in FIG. 17C.

Figure 18A:
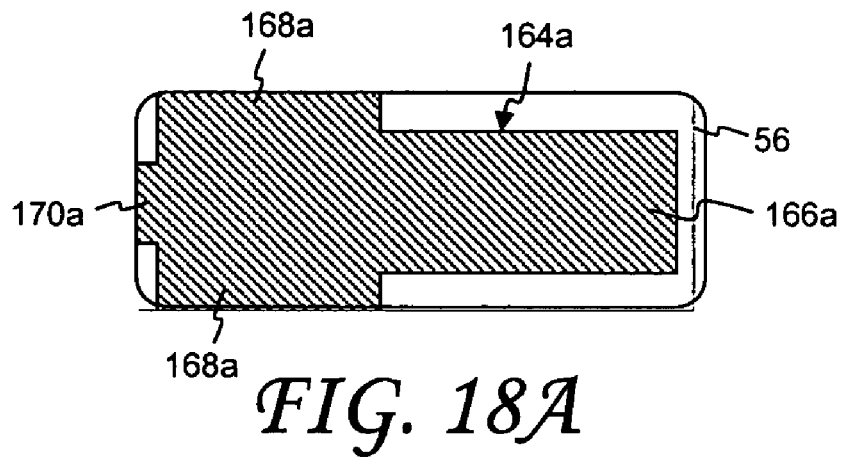
FIGS. 18A and 18B provide plan views of an eighth example of respective first and second polarity electrodes for use in a capacitor embodiment of the present technology.
Figure 18B:
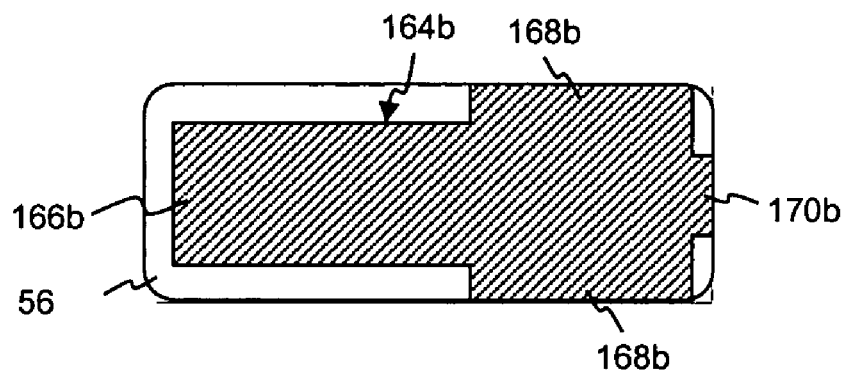
Figure 18C:
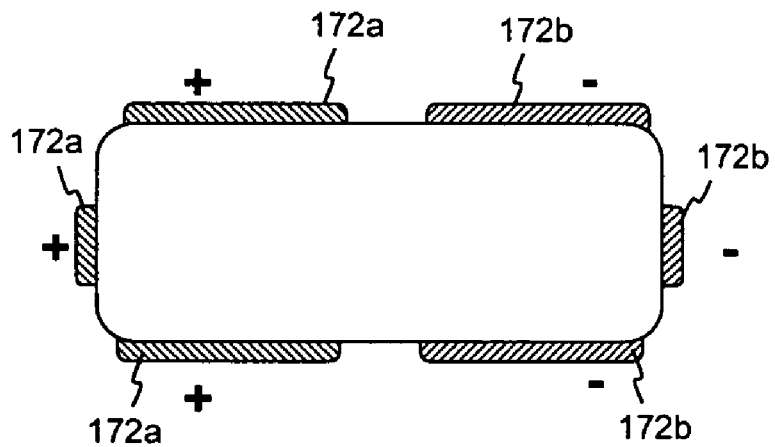
FIG. 18C provides a side view of a terminated capacitor incorporating the exemplary electrodes of FIGS. 18A and 18B.

Referring now to another exemplary electrode configuration for use in accordance with aspects of the present capacitor technology, a first exemplary electrode 164a as provided on a dielectric sheet 56 is depicted in the plan view of FIG. 18A. First electrode 164a includes a main portion 166a applied generally in the center of dielectric sheet 56. Two tab portions 168a extend from respective longer sides of main portion 168a in substantially opposing locations, and in a manner such that the tab portions 168a are flush with a shorter side of main portion 166a. Such shorter side of main portion 166a is also in direct contact with tab portion 170a, which may sometimes be smaller than the tab portions 168a. Exemplary second electrode 164b (FIG. 18B) is formed in a similar but inverted fashion with respect to first electrode 164a. When a plurality of first electrodes 164a and second electrodes 164b are stacked in an alternating and interleaved fashion with a plurality of dielectric layers 56, in accordance with present subject matter, columns of tab portions 168a, 168b, 170a and 170b are arranged in columns such that respective positive (+) terminations 172a and negative (−) terminations 172b are formed on the device periphery, as illustrated in FIG. 18C.

Figure 19A:
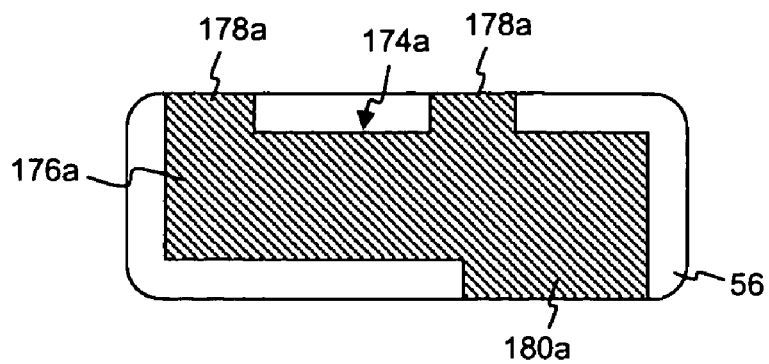
FIGS. 19A and 19B provide plan views of a ninth example of respective first and second polarity electrodes for use in a capacitor embodiment of the present technology.
Figure 19B:
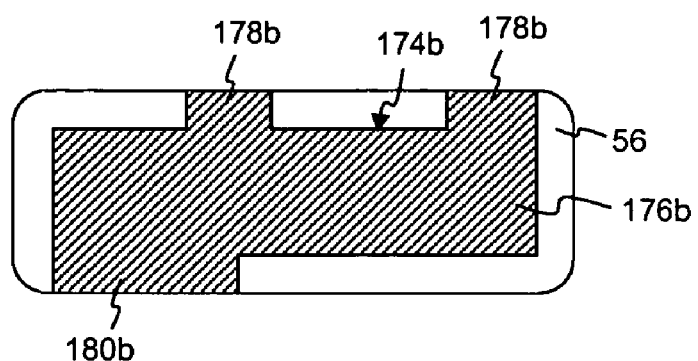
Figure 19C:
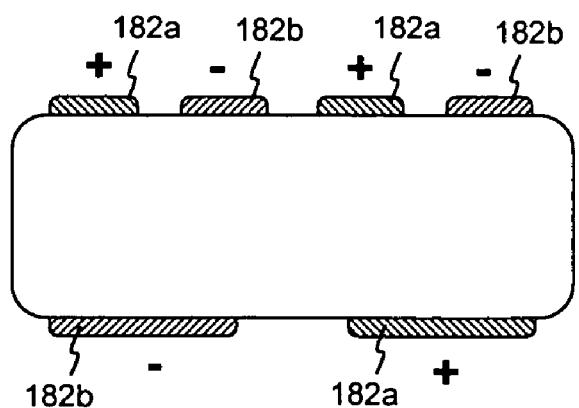
FIG. 19C provides a side view of a terminated capacitor incorporating the exemplary electrodes of FIGS. 19A and 19B.

Yet another present exemplary electrode configuration is represented in FIGS. 19A through 19C, respectively. First electrode 174a (FIG. 19A) includes a main portion 176a provided generally in the center of a dielectric sheet 56. Upper tab portions 178a extend from respective locations of a given longer side of main portion 176a, where one of tab portions 178a is flush with a shorter side of main portion 176a. An additional tab portion 180a (longer than tab portions 178a extends from the longer side of main portion 176a opposite to the given longer side and is substantially flush with the other shorter side. Second electrode 174b (FIG. 19B) is formed in a similar but inverted fashion with respect to first electrode 174a. When a plurality of first electrodes 174a and 174b are stacked, in accordance with present subject matter, in an alternating and interleaved fashion with a plurality of dielectric layers 56, columns of tab portions 178a, 178b, 180a and 180b are arranged in columns such that respective positive (+) terminations 182a and negative (−) terminations 182b are formed on the device periphery, as illustrated in FIG. 19C.

Another exemplary embodiment in accordance with the present subject matter is illustrated in and will now be discussed with reference to FIGS. 20A through 20E.

Figure 20A:
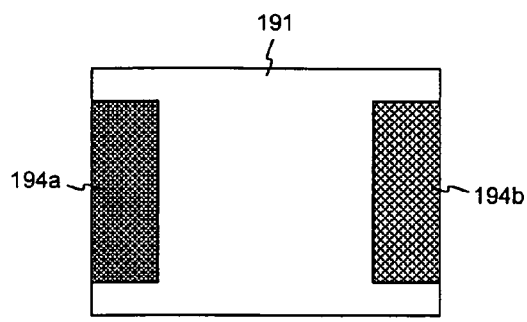
FIGS. 20A and 20B provide respective top and bottom views of opposing mounting surfaces of a capacitor embodiment of the present technology incorporating a tenth example of respective first and second polarity electrodes, such as those illustrated in the respective plan views of FIGS. 20C and 20D.
Figure 20B:
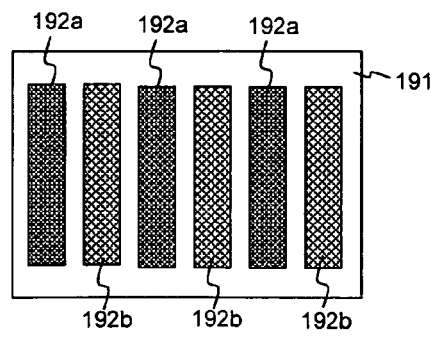
Figure 20C:
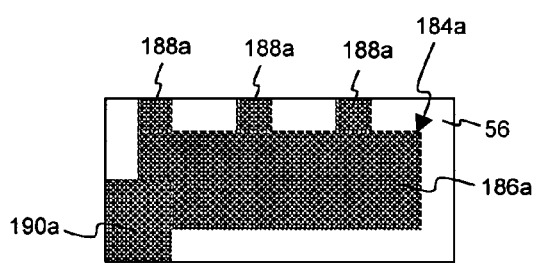
FIG. 20E provides a side view of a terminated capacitor such as illustrated in FIGS. 20A and 20B when mounted to another electronic component.
Figure 20D:
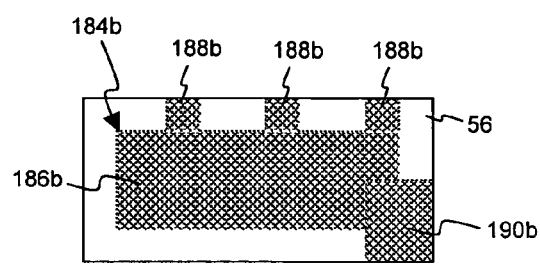

FIGS. 20C and 20D provide plan views of respective exemplary first and second electrodes 184a and 184b. First electrode 184a includes a main portion 186a that is positioned in the center of a dielectric sheet 56. Three tab portions 188a extend from a given longer side of main portion 186a, and one of the tab portions 188a is substantially flush with a shorter side of main portion 186a. Another tab portion 190a extends from the same shorter side as well as from the longer side opposite to the given longer side from which tabs 188a extend. Exemplary second electrode 184b is formed in a similar but inverted fashion relative to first electrode 184a.

Respective views of a capacitor generally 191 that results from alternately stacking first and second electrodes 184a and 184b with a plurality of dielectric layers 56, and providing terminations therefore, are provided in FIGS. 20A and 20B. FIG. 20B provides a plan view of the mounting surface for such exemplary capacitor 191, and on which three positive termination lands 192a and three negative termination lands 192b are formed over respective aligned columns of exposed portions of tabs 188a and 188b. FIG. 20A provides a plan view of the surface opposite the mounting surface illustrated in FIG. 20B, and on which one positive termination land and one negative termination land is formed over respective aligned columns of exposed portions of respective tabs 190a and 190b.

Figure 20E:
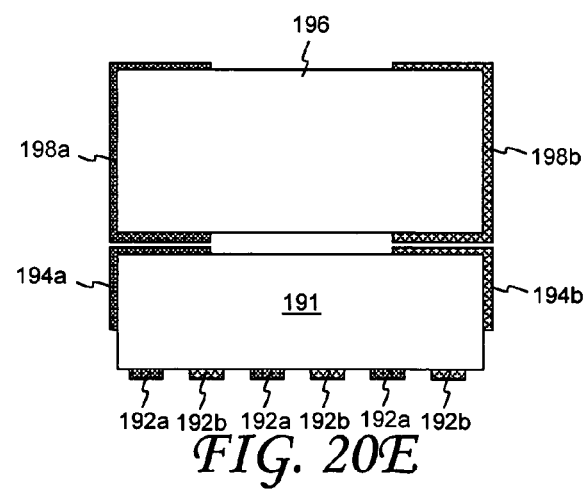

Terminations 194a and 194b are formed continuously from the surface shown in FIG. 20C onto opposing side surfaces adjacent to such surface, as also seen in representative FIG. 20E. The portions of termination lands 194a and 194b that are on the surface opposite the capacitor mounting surface may be used to attach another component 196, such as a separate multilayer capacitor, resistor or other chip structure, thereto. A first termination 198a associated with additional component 196 may be coupled to termination land 194a of capacitor 191, while a second termination 198b associated with additional component 196 may be coupled to termination land 194b of capacitor 191.

A still further exemplary embodiment of the present technology corresponds to that represented in the views of FIGS. 21A through 21I, respectively. A plan view of the mounting surface for such exemplary capacitor 200 is shown in FIG. 21B, while a plan view of the surface opposing the mounting surface for such capacitor generally 200 is shown in FIG. 21A. The exemplary mounting surface includes thereon a four-by-six array of peripheral termination lands, including twelve positive terminations 202a and twelve negative terminations 202b. A single termination 204a for connecting all positive electrodes of the same (positive) polarity together and a single termination 204b for connecting all negative electrodes together are formed on another side of capacitor 200, as represented in FIG. 21A.

Respective layouts of different exemplary positive and negative electrodes that are variously combined to form such a capacitor 200 are provided in FIGS. 21C through 21H. To form sections A indicated in FIG. 21B, a plurality of first positive electrodes 206a (as shown in FIG. 21C) are alternately stacked with a plurality of first negative electrodes 208a (as shown in FIG. 21D) among a plurality of dielectric sheets 56. A plurality of second positive electrodes 206b (shown in FIG. 21E) and a plurality of second negative electrodes 208b (shown in FIG. 21F) are alternately stacked with a plurality of dielectric layers 56 to form sections B of capacitor 200 (as indicated in FIG. 21B). To form sections C of FIG. 21B, third positive electrodes 206c (of FIG. 21G) and third negative electrodes 208c (of FIG. 21H) are utilized in accordance with present subject matter.

Referring still to FIGS. 21C through 21H, each of the three different positive electrodes 206a, 206b and 206c includes a main portion 209a and tab portion 210a that extends to and is exposed in a first corner of capacitor 200. First positive electrode 206a also includes three tab portions 212a that extend to a mounting surface of the capacitor 200 (such as the surface depicted in FIG. 21B). Positive terminations 202a are formed over and connect the aligned groups of exposed tab portions 212a in sections A of capacitor 200. Tabs 212a' of third positive electrode 206c also extend to the capacitor mounting surface but in locations that do not align with the tab portions 212a of first positive electrode 206a. Positive terminations 202a are formed over and connect the aligned groups of exposed tab portions 212a' in sections C of capacitor 200.

Each negative electrode 208a, 208b and 208c includes a respective main portion 209b and tab portion 210b. Tab portions 210b are exposed in a column along a corner edge of capacitor 200 such that termination 204b be may be formed thereon. First negative electrode 208a also includes three tab portions 212b that extend to a mounting surface of the capacitor 200 (such as the surface depicted in FIG. 21B). Negative terminations 202b are formed over and connect the aligned groups of exposed tab portions 212b in sections A of capacitor 200. Tabs 212b' of third negative electrode 208c also extend to the capacitor mounting surface but in locations that do not align with the tab portions 212b of first negative electrode 208a. Additional negative terminations 202b are formed over and connect the aligned groups of exposed tab portions 212b' in sections C of capacitor 200.

Referring now to FIG. 21I, respective terminations 204a and 204b are formed continuously from the surface shown in FIG. 21A onto opposing side surfaces adjacent to such surface, as also seen in FIG. 21I. Those portions of termination lands 204a and 204b that are on the surface opposite the capacitor mounting surface may be used to attach another component 196, such as a separate multilayer capacitor, resistor or other chip structure, thereto. A first termination 198a associated with additional component 196 may be coupled to termination land 204a of capacitor 200, while a second termination 198b associated with additional component 196 may be coupled to termination land 204b of capacitor 200.

Figure 22A:
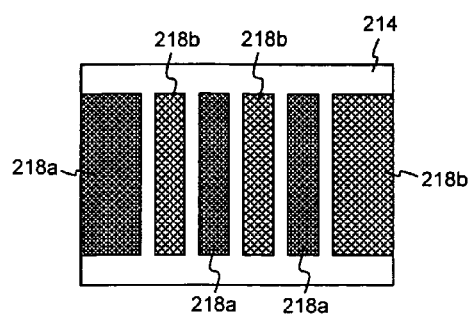
FIGS. 22A and 22B provide respective top and bottom views of opposing mounting surfaces of a capacitor embodiment of the present technology incorporating a twelfth example of respective first and second polarity electrodes, such as those illustrated in the respective plan views of FIGS. 22C-22H.
Figure 22B:
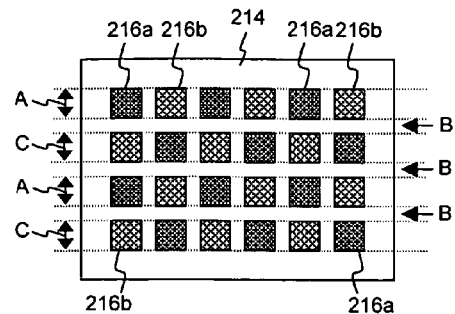

Another exemplary embodiment of the present technology corresponds to that represented in the views of FIGS. 22A through 22H, respectively. A plan view of the mounting surface for such exemplary capacitor generally 214 is shown in FIG. 22B, while a plan view of the surface opposing the mounting surface for such capacitor 214 is shown in FIG. 22A. Such exemplary mounting surface includes thereon a four-by-six array of peripheral termination lands, including twelve positive terminations 216a and twelve negative terminations 216b. Three positive termination lands 218a and three negative termination 218b are formed on the side surface of capacitor 214 opposite such mounting surface.

Figure 22C:
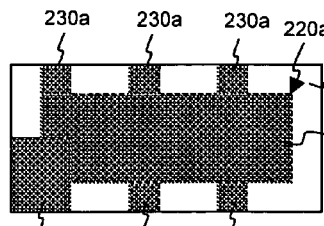
Figure 22E:
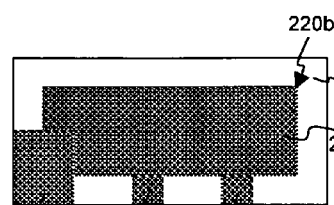
Figure 22G:
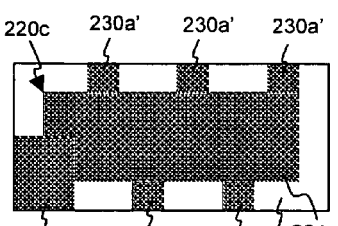
Figure 22D:
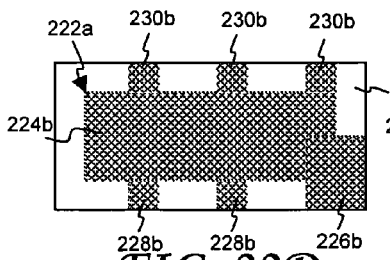
Figure 22F:
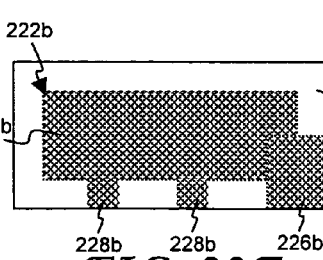
Figure 22H:
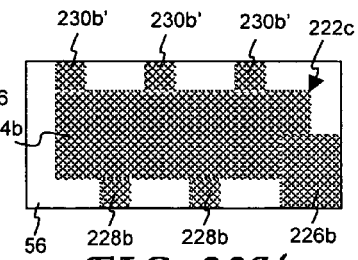

Respective layouts of different exemplary positive and negative electrodes that are variously combined to form such a capacitor generally 214 are provided in FIGS. 22C through 22H. To form sections A indicated in FIG. 22B, a plurality of first positive electrodes 220a (as shown in FIG. 22C) are alternately stacked with a plurality of first negative electrodes 222a (as shown in FIG. 22D) among a plurality of dielectric sheets 56. A plurality of second positive electrodes 220b (shown in FIG. 22E) and a plurality of second negative electrodes 222b (shown in FIG. 22F) are alternately stacked with a plurality of dielectric layers 56 to form sections B of capacitor 214 (as indicated in FIG. 22B). To form sections C of FIG. 22B, third positive electrodes 220c (of FIG. 22G) and third negative electrodes 222c (of FIG. 22H) are utilized in accordance with present subject matter.

Referring still to FIGS. 22C through 22H, each of the three different positive electrodes 220a, 220b and 220c includes a main portion 224a and tab portions 226a and 228a that extend to and are exposed on the surface of capacitor 214 opposite to the capacitor mounting surface. Respective tabs 226a are exposed along a capacitor edge. In other words, tabs 226a are exposed along two adjacent side surfaces. First positive electrode 220a also includes three tab portions 230a that extend to a mounting surface of the capacitor 214 (such as the surface depicted in FIG. 22B). Positive terminations 216a are formed over and connect the aligned groups of exposed tab portions 230a in sections A of capacitor 214. Tabs 230a' of third positive electrode 220c also extend to the capacitor mounting surface but in locations that do not align with the tab portions 230a of first positive electrode 220a. Positive terminations 216a are formed over and connect the aligned groups of exposed tab portions 230a' in sections C of capacitor 214, in accordance with present subject matter.

Each negative electrode 222a, 222b and 222c includes a respective main portion 224b and tab portions 226b and 228b. Tab portions 226b are exposed in a column along a corner edge of capacitor 214, and tab portions 228b are exposed (along with tab 226b) on the surface of capacitor 214 opposite the mounting surface. Respective terminations 218a and 218b as seen in FIG. 22A can be formed on the capacitor surface opposite the mounting surface. It should be appreciated that the outermost positive termination 218a and the outermost negative termination 218b shown in FIG. 22A may be formed continuously from the surface shown in FIG. 22A onto opposing side surfaces adjacent to such illustrated surface. First negative electrode 222a also includes three tab portions 230b that extend to a mounting surface of the capacitor 214 (such as the surface depicted in FIG. 22B). Negative terminations 216b are formed over and connect the aligned groups of exposed tab portions 230b in sections A of capacitor 214. Tabs 230b' of third negative electrode 222c also extend to the capacitor mounting surface but in locations that do not align with the tab portions 230b of first negative electrode 222a. Additional negative terminations 216b are formed over and connect the aligned groups of exposed tab portions 230b' in sections C of capacitor 214, in accordance with present subject matter.

Figure 23A:
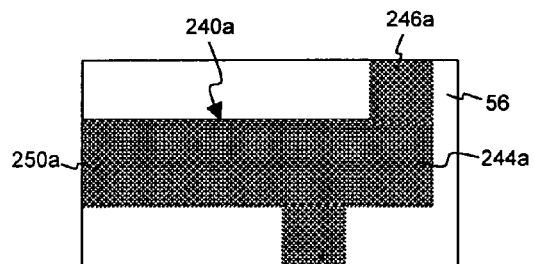
FIGS. 23E and 23F provide respective views of a mounting surface and side surface of a capacitor embodiment of the present technology incorporating a thirteenth example of respective first and second polarity electrodes, such as those illustrated in the respective plan views of FIGS. 23A-23D.
Figure 23C:
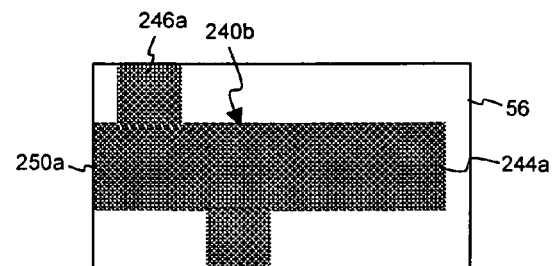
Figure 23B:
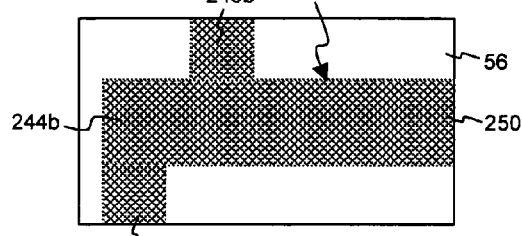
Figure 23D:
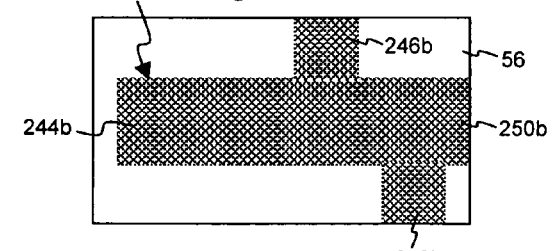
Figure 23E:
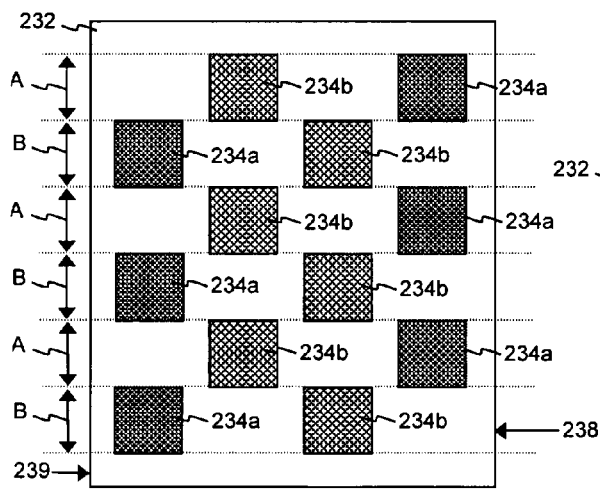
Figure 23F:
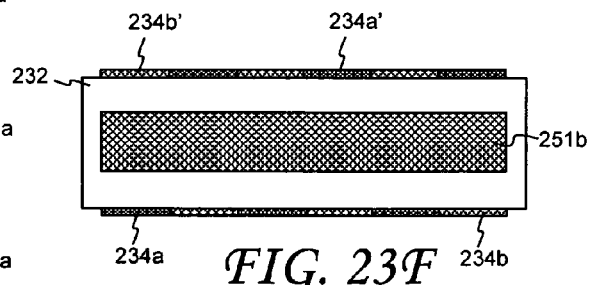

Yet another exemplary embodiment of the present technology corresponds to that represented in the views of FIGS. 23A through 23F, respectively. A plan view of the mounting surface for such exemplary capacitor generally 232 is shown in FIG. 23E, while a plan view of a side surface adjacent to the mounting surface for such capacitor 232 is shown in FIG. 23F. Such mounting surface includes thereon an array of peripheral termination lands, including six positive terminations 234a and six negative terminations 234b. One positive termination land 236b is formed on a side surface of capacitor 232 adjacent to the mounting surface illustrated in FIG. 23E (looking in from the right side generally 238 of the capacitor relative to the view of FIG. 23E).

Respective layouts of different exemplary positive and negative electrodes that are variously combined to form such a capacitor 232 are provided in FIGS. 23A through 23D. To form sections A indicated in FIG. 23E, a plurality of first positive electrodes 240a (as shown in FIG. 23A) are alternately stacked with a plurality of first negative electrodes 242a (as shown in FIG. 23B) among a plurality of dielectric sheets 56. A plurality of second positive electrodes 240b (shown in FIG. 23C) and a plurality of second negative electrodes 242b (shown in FIG. 23D) are alternately stacked with a plurality of dielectric layers 56 to form sections B of capacitor 232 (as indicated in FIG. 23E).

Referring still to FIGS. 23A through 23D, each of the two different positive polarity electrodes 240a and 240b includes a main portion 244a and respective tab portions 246a, 248a and 250a that are in direct contact with the main portion 244a and extend to various peripheral locations along capacitor 232. Tab portions 246a extend to a mounting surface (i.e., the surface illustrated in FIG. 23E), tab portions 248a extend to the surface directly opposite such mounting surface, and tab portions 250a extend to a given side surface of capacitor 232 (namely, the surface looking into the left from direction generally 239 in FIG. 23E). Positive terminations 234a are formed over and connect the aligned groups of exposed tab portions 246a of first polarity electrodes 240a and 240b. Positive terminations 234a' are formed over and connect the aligned groups of exposed tab portions 248a of first polarity electrodes 240a and 240b. A side termination 251a (not illustrated, but directly opposite side termination 252b shown in FIG. 23F) is formed over and connects tab portions 250a that extend to such side surface.

Each of the two different negative polarity electrodes 242a and 242b includes a main portion 244b and respective tab portions 246b, 248b and 250b that are in direct contact with the main portion 244b and extend to various peripheral locations along capacitor 232. Tab portions 246b extend to a mounting surface (i.e., the surface illustrated in FIG. 23E), tab portions 248b extend to the surface directly opposite such mounting surface, and tab portions 250b extend to a given side surface of capacitor 232 (namely, the surface looking into the right from direction generally 238 in FIG. 23E). Negative terminations 234b are formed over and connect the aligned groups of exposed tab portions 246b of second (negative) polarity electrodes 242a and 242b. Negative terminations 234b' are formed over and connect the aligned groups of exposed tab portions 248b of second polarity electrodes 242a and 242b. A side termination 251b (shown in FIG. 23F) is formed over and connects tab portions 250b that extend to such side surface, in accordance with present subject matter.

Figure 24A:
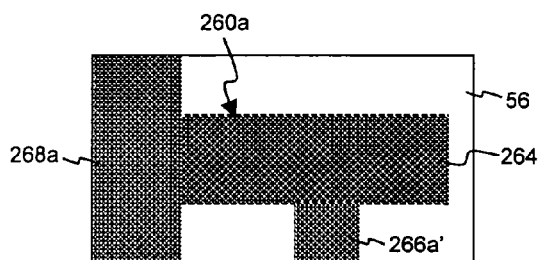
FIGS. 24E and 24F provide respective views of a mounting surface and a side surface of a capacitor embodiment of the present technology incorporating a fourteenth example of respective first and second polarity electrodes, such as those illustrated in the respective plan views of FIGS. 24A-24D.
Figure 24C:
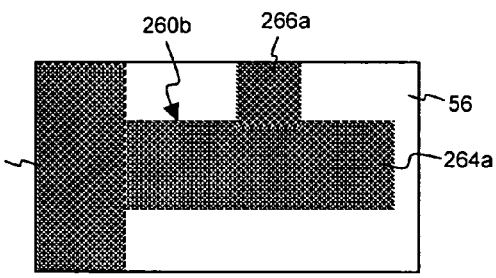
Figure 24B:
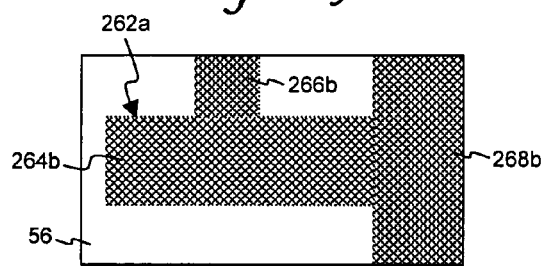
Figure 24D:
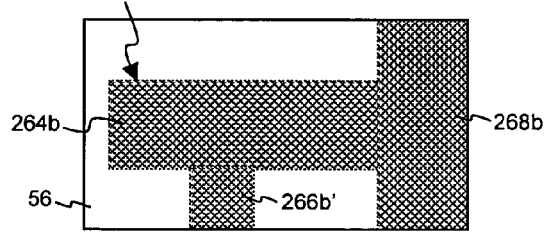
Figure 24E:
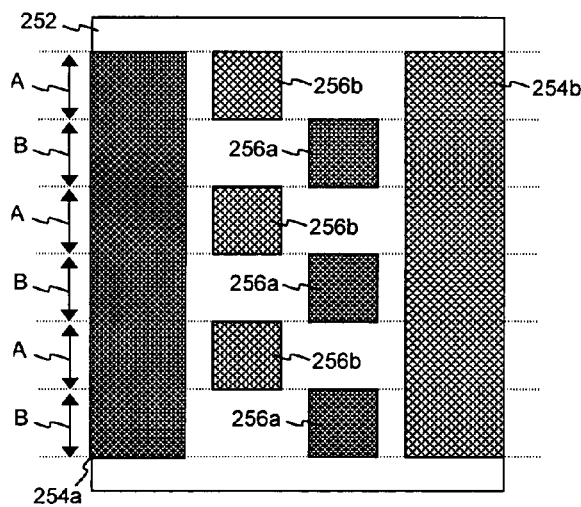
Figure 24F:
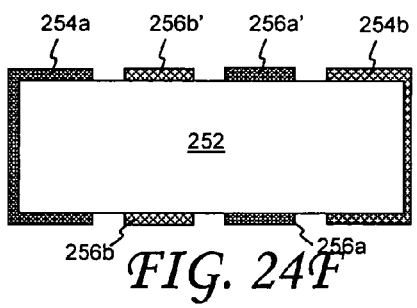

Yet another exemplary embodiment of the present technology corresponds to that represented in the views of FIGS. 24A through 24F, respectively. A plan view of the mounting surface for such exemplary capacitor generally 252 is shown in FIG. 24E, while a plan view of a side surface adjacent to such mounting surface for capacitor 252 is shown in FIG. 24F. Such mounting surface includes thereon an array of peripheral termination lands, including respective positive and negative wrap-around terminations 254a and 254b, three positive terminations 256a and three negative terminations 256b on the mounting surface shown in FIG. 24E, and three positive terminations 256a' and three negative terminations 256b' on the surface opposite such mounting surface.

Respective layouts of different exemplary positive and negative electrodes that are variously combined to form such a capacitor 252 are provided in FIGS. 24A through 24D. To form sections A indicated in FIG. 24E, a plurality of first positive electrodes 260a (as shown in FIG. 24A) are alternately stacked with a plurality of first negative electrodes 262a (as shown in FIG. 24B) among a plurality of dielectric sheets 56. A plurality of second positive electrodes 260b (shown in FIG. 24C) and a plurality of second negative electrodes 262b (shown in FIG. 24D) are alternately stacked with a plurality of dielectric layers 56 to form sections B of capacitor 252 (as indicated in FIG. 24E), in accordance with present subject matter.

Referring still to FIGS. 24A through 24D, each of the two different positive polarity electrodes 260a and 260b includes a main portion 264a, a tab portion (either 266a or 266a') that extends to one side of capacitor 252, and tab portion 268a that extends to three sides of capacitor 252. Each tab portion 266a, 266a' and 268a is in direct contact with a respective main portion 264a. Tab portions 266a extend to a mounting surface (i.e., the surface illustrated in FIG. 24E) and tab portions 266a' extend to the surface directly opposite such mounting surface. Positive wrap-around termination 254a is formed over and connects the aligned groups of exposed tab portions 268a of first polarity electrodes 260a and 260b. Positive terminations 256a' are formed over and connect the aligned groups of exposed tab portions 266a' of first polarity electrode 260a. Positive terminations 256a are formed over and connect the aligned groups of exposed tab portions 266a of first polarity electrode 260b.

Each of the two different negative polarity electrodes 262a and 262b includes a main portion 264b, a tab portion (either 266b or 266b') that extends to one side of capacitor 252, and tab portion 268b that extends to three sides of capacitor 252. Each tab portion 266b, 266b' and 268b is in direct contact with a respective main portion 264b. Tab portions 266b extend to a mounting surface (i.e., the surface illustrated in FIG. 24E) and tab portions 266b' extend to the surface directly opposite such mounting surface. Negative wrap-around termination 254b is formed over and connects the aligned groups of exposed tab portions 268b of second polarity electrodes 262a and 262b. Negative terminations 256b' are formed over and connect the aligned groups of exposed tab portions 266b' of second polarity electrode 262b. Negative terminations 256b are formed over and connect the aligned groups of exposed tab portions 266b of second polarity electrode 262a.

Additional exemplary performance characteristics of capacitor embodiments in accordance with the presently disclosed technology, sometimes compared with the performance of prior art capacitors, will now be discussed.

Figure 25:
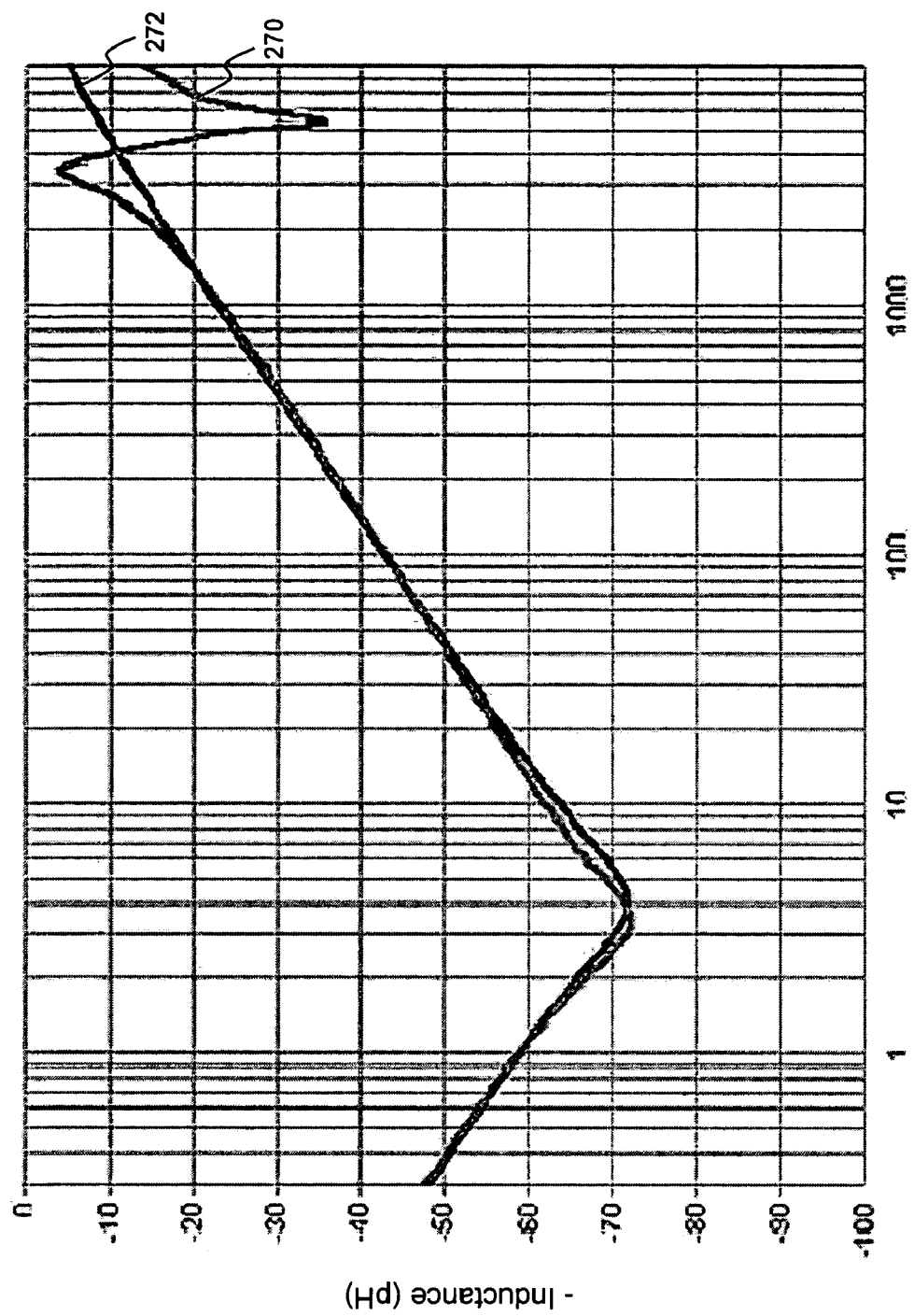
FIG. 25 provides a graphical illustration of measured and modeled inductance values versus frequency for an 0805 land-grid array capacitor embodiment in accordance with the present subject matter.

FIG. 25 shows a graphical representation of inductance values (in picoHenries) versus frequency (in MegaHertz) for a capacitor such as one built in a similar fashion as capacitor generally 50 of FIG. 7B and with an 0805 case size, all in accordance with present subject matter. Plot 270 corresponds to measured values for such a capacitor and plot 272 corresponds to values from a linear model for such a capacitor. Such a capacitor with high frequency performance characteristics as represented in FIG. 25 may be rated with a capacitance of about 5.6 µF, an inductance of about forty-nine (49) pH, and an ESR (Equivalent Series Resistance) of about three (3) mΩ. The measured values of plot 270 compare very favorably with the linear modeled values of plot 272.

Figure 26:
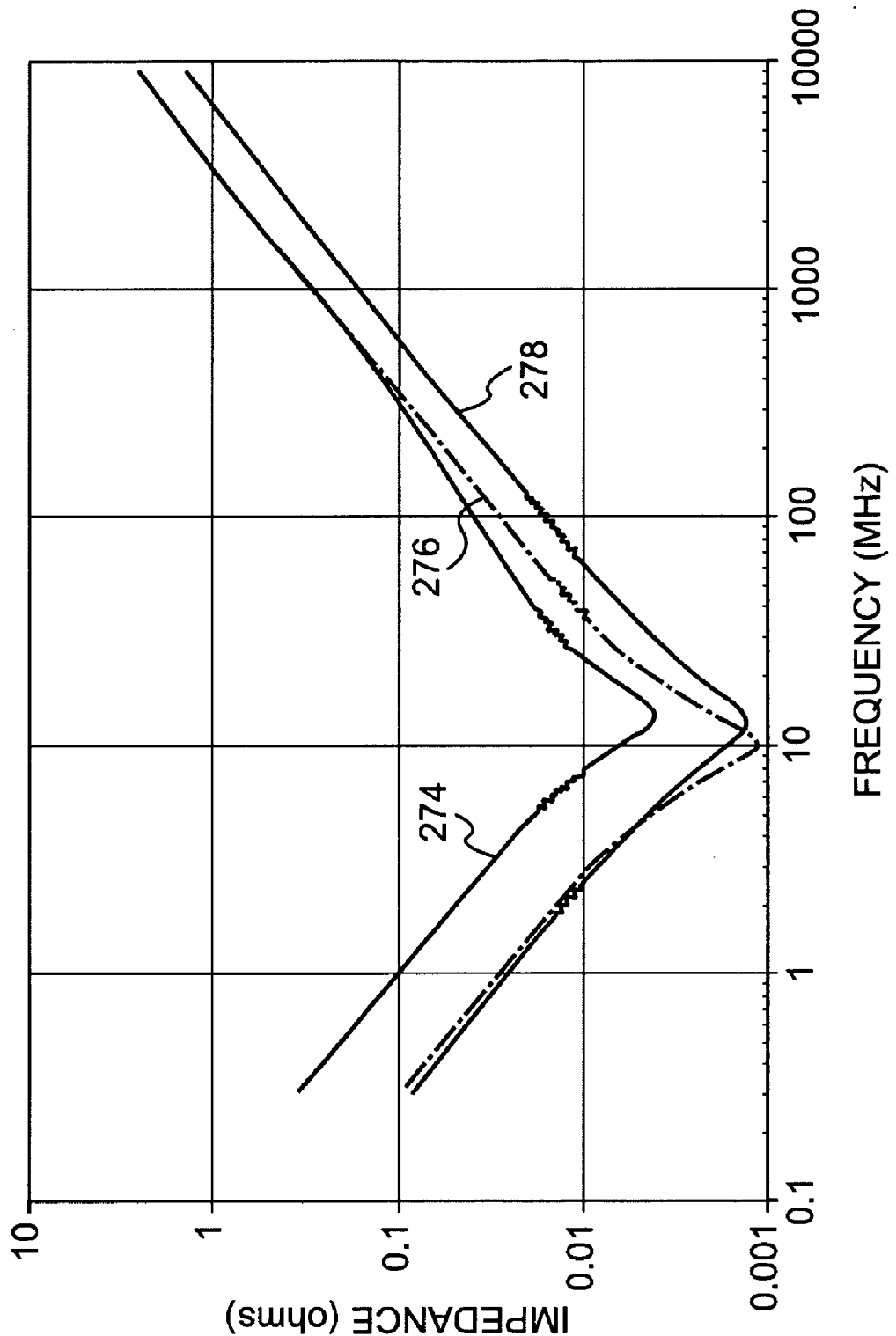
FIG. 26 provides a graphical illustration of impedance versus frequency for an 0508 prior art capacitor and two different 0805 capacitors designed in accordance with aspects of the present subject matter

FIG. 26 provides a graphical representation of the absolute value of the impedance (|Z|) in ohms versus frequency (in MHz) for two exemplary capacitors formed in accordance with aspects of the presently disclosed technology compared with that of a prior art capacitor. The plots in FIG. 26 correspond to fitted curves that were obtained from Network Analyzer Measurements. Plot 274 corresponds to |Z| values for an eight-terminal prior art interdigitated capacitor having an 0508 case size and a capacitance rating of 2.2 µF. Plot 276 corresponds to |Z| values for a two-terminal 0805 capacitor rated at about 6.8 µF, such as one built similar to capacitor generally 74 of FIG. 6, in accordance with present subject matter. Plot 278 provides |Z| values for a four-terminal 0805 capacitor also rated at about 6.8 µF, such as one built similar to capacitor generally 86 of FIG. 7C, also in accordance with present subject matter.

FIGS. 27A through 27D depict aspects of a capacitor 2700 similar to that of FIGS. 15A-15C and corresponding to electrode layers 2700a, 2700b each having generally U-shaped lands and additionally including anchor tabs to assist in the termination process. In such a device, a first electrode 2752a (FIG. 27A) is provided in the center of a dielectric sheet 2756, but has portions thereof that extend to a given mounting surface and are exposed continuously from the given mounting surface along an adjacent side surface and to the surface opposite the mounting surface. Second electrode 2752b (FIG. 27B) is formed in similar arrangement, but inverted. As may be seen from an inspection of FIGS. 27A, 27B; anchor tabs 2754a, 2758a (FIG. 27A) and 2754b, 2758b (FIG. 27B) are provided along the previously (as in FIGS. 15A, 15B) uncovered areas of dielectric sheet 2756.

Anchor tabs 2754a, 2758a and 2754b, 2758b are conductive, electrically isolated layers that assist in controlling application of termination material as will be discussed more fully with respect to FIGS. 30C, 30F, 30I, 31C, 31F, and 31I but, in brief, such anchor tabs function as nucleation points for the termination plating material and thereby assist in directing the plating process. Terminations for capacitors constructed in accordance with the present subject matter may be formed with a plating process as described in previously mentioned and incorporated U.S. patent application Ser. No. 10/409,023 entitled "Plated Terminations" or by way of other processes including different techniques such as an evaporation or sputtering process; patterned metallization by way of laser etching, photo-lithographic methods, or a similar technique; and single layer metallization or multilayered termination as previously described.

With reference to FIG. 27C there is illustrated, in exploded view, a stack of electrodes 2700a, 2700b alternately corresponding to those illustrated in FIGS. 27A and 27B. It should be appreciated that the stack of electrodes illustrated in FIGS. 27C and 27D is representative only and that there may be, in fact, a relatively larger number of layers than those illustrated.

FIG. 27D is a top view of a partially assembled capacitor 2700 prior to termination illustrating the alternating electrode layers 2700a, 2700b. Termination examples for capacitor 2700 will be discussed more fully later with respect to FIGS. 30-31.

With reference now to FIGS. 28A-28E, an additional exemplary capacitor 2800 constructed in accordance with the present subject matter is illustrated. As may be seen from a comparison with exemplary capacitor 2700 illustrated in FIGS. 27A-27D, capacitor 2800 is similar in every respect to capacitor 2700 but with the addition of layer 2800b.

As may be observed from FIG. 28B, layer 2800b corresponds to a dielectric sheet 2856 on which are provided four electrically isolated anchor tabs 2852a, 2852b, 2854a, 2854b. As with the anchor tabs illustrated with exemplary capacitor 2700, anchor tabs 2852a, 2852b, 2854a, 2854b function as nucleation points for the termination plating material and thereby assist in directing the plating process as will be more fully described with reference to FIGS. 30-31. In accordance with the present subject matter, the provision of layer 2800b provides the possibility for additional effective reduction in spacing between terminations and thus provides an additional reduction in equivalent series inductance (ESL) by providing the possibility of an interdigitated termination for the capacitor as illustrated in FIGS. 30-31.

With further reference to FIGS. 28A-28E, electrode layers 2800a, 2800b, 2800c may be designated as layers "A," "B," and "C" respectively. As more specifically illustrated in FIGS. 28D and 28E, an exemplary capacitor 2800 constructed in accordance with the present subject matter may be constructed by stacking layers in repeating sequences corresponding to A-B-C-B so as to produce a stack as illustrated in exploded view in FIG. 28D and in pre-terminated partially assembled view in FIG. 28E.

With reference now to FIG. 29E, illustrated is a perspective view of a partially assembled capacitor 2900 similar to previously illustrated capacitor 2800 in FIG. 28E prior to application of termination material. As with prior embodiments, termination of capacitor 2900 may be accomplished using various of the techniques previously described.

With reference now to FIGS. 30A through 30I, there is illustrated a first methodology for terminating exemplary capacitors 2700, 2800, 2900. As may be observed, FIGS. 30A, 30D, and 30G are identical to FIGS. 27D, 28E, and 29E, respectively and illustrate respective capacitors 2700, 2800, 2900 and their exposed electrodes. FIGS. 30B, 30E, and 30H each represent a first termination step wherein a copper (Cu) electroless plating process may be used to plate a first layer of copper on the exposed electrode edges. Over time during the plating process, the space between fingers 3010, 3012; 3020, 3022; and 3030, 3032 is reduced. Care must be taken to limit the plating process so as to prevent shorting between adjacent fingers. Following the Cu electroless plating, a Cu/Ni/Sn electrolytic plating process may be carried out. That is, an initial layer of plated Copper (Cu), on top of which a layer of Nickel (Ni) then a layer of Tin (Sn) is used to produce the finished structure. As previously noted, the production of a component with interdigitated fingers as fingers 3010, 3012; 3020, 3022; and 3030, 3032 allows an additional reduction in equivalent series inductance for the finished structures.

Figure 31A:
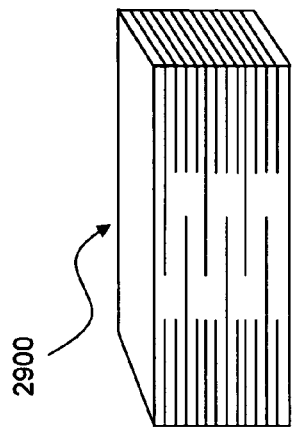
FIGS. 31A through 31C, 31D through 31F, and 31G through 31I respectively illustrate perspective views of the embodiments illustrated in FIGS. 27 through 29 including an optional masking step usable with the plating sequences for the different anchor tab embodiments.
Figure 31B:
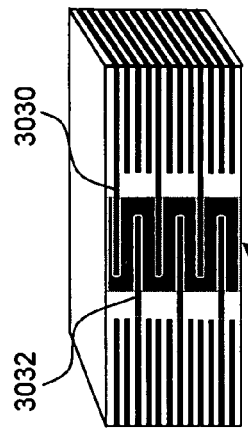
Figure 31C:
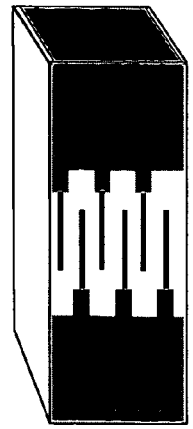
Figure 31D:
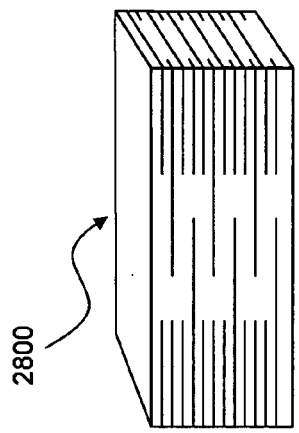
Figure 31E:
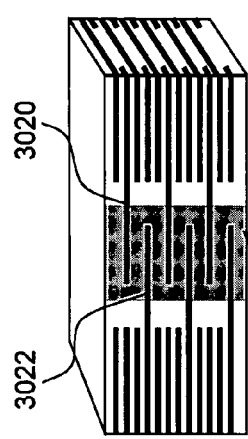
Figure 31F:
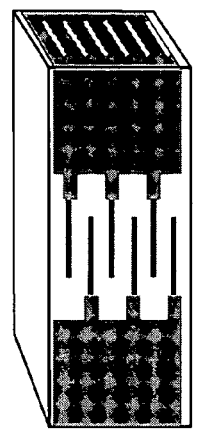
Figure 31G:
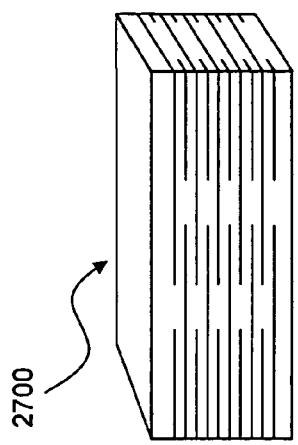
Figure 31H:
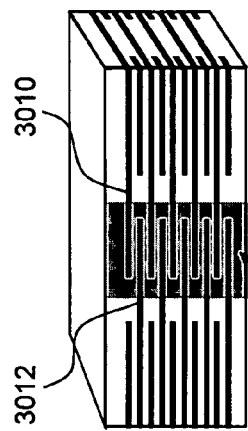
Figure 31I:
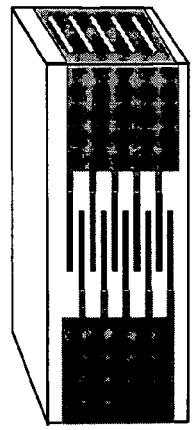

With reference now to FIGS. 31A through 31I, there is illustrated a second methodology for terminating exemplary capacitors 2700, 2800, 2900. As with FIGS. 30A through 30I, FIGS. 31A, 31D, and 31G are identical to FIGS. 27D, 28E, and 29E, respectively and illustrate respective capacitors 2700, 2800, 2900 and their exposed electrodes. FIGS. 31B, 31E, and 31H each represent first and second termination steps wherein a copper (Cu) electroless plating process may be first used to plate a first layer of copper on the exposed electrode edges in substantially the same manner as with the devices illustrated in FIGS. 30B, 30E, and 30H. Over time during the plating process, the space between fingers 3010, 3012; 3020, 3022; and 3030, 3032 is reduced. In order to limit the possibility of shorting fingers 3010, 3012; 3020, 3022; and 3030, 3032, a masking layer 3110, 3120, 3130 is placed over the fingers. After the masking material is in place a Cu/Ni/Sn electrolytic plating process may be carried out. As the critical area between the fingers 3010, 3012; 3020, 3022; and 3030, 3032 has been protected, plating may safely proceed without fear of producing shorted components.

It should be appreciated that the capacitor embodiments and corresponding electrode configurations presented herein are presented merely as examples of the disclosed technology, including intermediate aspects thereof. Variations of the disclosed embodiments as will be appreciated by those of ordinary skill in the art may be practiced.

Further, it should be appreciated that the various representations or descriptions herein of certain surfaces as top, bottom or side surfaces is used merely for convenience of reference, and should not be unnecessarily limiting to the different potential ways in which the components disclosed herein can be oriented. Furthermore, reference herein to selected surfaces as mounting surfaces is generally intended to mean that such surface is the one that will be positioned in a substantially adjacent fashion to and attached to a mounting location, such as a substrate. In some instances, however, the chip surface directly opposite the so-called or described mounting surface may also be utilized as a mounting surface, being either attached to a substrate or to another chip. Such may be the case, for example, when the given mounting surface and the surface directly opposite such designated mounting surface are both provided with surface lands, sometimes formed with symmetrical, mirrored or reverse-mirrored geometries, or with differently shaped geometries.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. A multilayer electronic component, comprising:
   a plurality of first electrode layers, each first electrode layer comprising a first dielectric layer having first and second surfaces thereof bounded by four edges and a first conductive layer covering a portion of said first surface of said first dielectric layer and extending to at least a portion of one edge of said first dielectric layer;
   a plurality of second electrode layers alternately stacked with said plurality of first electrode layers, each second electrode layer comprising a second dielectric layer having first and second surfaces thereof bounded by four edges and a second conductive layer covering a portion of said first surface of said second dielectric layer and extending to at least a portion of one edge of said second dielectric layer, the second conductive layer formed as a mirror image of the first conductive layer;
   a first conductive termination layer covering a portion of said at least one edge of said first electrode layer and electrically connecting said first conductive layer of each of said plurality of first electrode layers; and
   a second conductive termination layer covering a portion of said at least one edge of said second electrode layer and electrically connecting said second conductive layer of each of said plurality of second electrode layers;
   wherein said first conductive termination layer and said second conductive termination layer are configured so as to form a gap therebetween along a portion of said at least one edge of both said first and second electrode layers;
   whereby a minimum current loop area is formed from said first conductive termination layer through said plurality of first electrode layers and plurality of second electrode layers to said second conductive termination layer.

2. A multilayer electronic component as in claim 1, further comprising:
   a first conductive via formed through at least one of said plurality of first electrode layers and configured to couple said first conductive layer to said first conductive termination layer; and
   a second conductive via formed through at least one of said plurality of second electrode layers and configured to couple said second conductive layer to said second conductive termination layer.

3. A multilayer electronic component as in claim 1, wherein said first conductive layer extends to at least a portion of two edges of said first dielectric layer and said second conductive layer extends to at least a portion of two edges of said second dielectric layer.

4. A multilayer electronic component as in claim 1, wherein said first and second conductive layers are selected from the group consisting of platinum, nickel, copper, and palladium-silver alloy.

5. A multilayer electronic component as in claim 1, wherein said first and second dielectric layers are selected from the group consisting of barium titanate, zinc oxide, alumina with low-fire glass, ceramics, glass-bonded materials, and an organic epoxy.

6. A multilayer electronic component as in claim 1, wherein said four edges of each of said first and second dielectric layers comprise two opposite relatively longer edges and two opposite relatively shorter edges, and wherein said conductive termination layers are formed along at least one of said relatively longer edges, whereby the multilayer electronic component may be configured for mounting on a substrate along said at least one of said relatively longer edges.

7. A multilayer electronic component as in claim 1, wherein said gap is between 100 and 400 microns.

8. A multilayer electronic component as in claim 7, wherein said gap is about 250 microns.

9. A multilayer electronic component as in claim 1, wherein said first conductive layer includes at least one portion extending to a portion of one edge of said first dielectric layer, and said second conductive layer includes at least one portion extending to a portion of an opposite edge of said second dielectric layer,
   whereby the portions of said first and second conductive layers provide conductive access to both said first and second electrode layers from both said one edge and said opposite edge.

10. A multilayer electronic component as in claim 1, wherein said first conductive layer includes at least two portions extending to a portion of one edge of said first dielectric layer and said second conductive layer includes at least two portions extending to a portion of one edge of said second dielectric layer,
    whereby the portions of said first and second conductive layers form an interleaved configuration upon stacking said first and second electrode layers.

11. A multilayer electronic component as in claim 1, wherein said first conductive layer includes at least two portions extending to a portion of each of opposite edges of said first dielectric layer and said second conductive layer includes at least two portions extending to a portion of each of opposite edges of said second dielectric layer, whereby the portions of said first and second conductive layers form interleaved configurations upon stacking said first and second electrode layers.

12. A multilayer electronic component as in claim 1, wherein said first conductive layer includes at least one portion extending to a portion of a first edge of said first dielectric layer and at least two portions extending to an edge of said first dielectric layer opposite to the first edge and said second conductive layer includes at least one portion extending to a portion of a first edge of said second dielectric layer and at least two portions extending to an edge of said second dielectric layer opposite to the first edge.

13. A multilayer electronic component as in claim 1, wherein said first conductive layer includes at least one portion extending to a portion of each of first, second, and third edges of said first dielectric layer and said second conductive layer includes at least one portion extending to a portion of first, second, and third edges of said second dielectric layer.

14. A multilayer electronic component as in claim 6, wherein portions of said first and second conductive layers extend to at least a portion of one of said relatively shorter edges and further comprising a termination layer formed along the at least one of said relatively shorter edges.

15. A multilayer electronic component as in claim 12, further comprising:
a third conductive termination layers covering a portion of the first edge of said first and second dielectric layers and electrically coupling the at least one portions of said plurality of first electrode layers; and
a fourth conductive termination layers covering a portion of the first edge of said first and second dielectric layers and electrically coupling the at least one portions of said plurality of second electrode layers,
whereby termination lands are provided for mounting other electrical components to the multilayer electronic component.

16. A multilayer electronic component as in claim 13, further comprising:
a third conductive termination layers covering a portion of the first edge of said first and second dielectric layers and electrically coupling the at least one portions of said plurality of first electrode layers; and
a fourth conductive termination layers covering a portion of the first edge of said first and second dielectric layers and electrically coupling the at least one portions of said plurality of second electrode layers,
whereby termination lands are provided for mounting other electrical components to the multilayer electronic component.

17. A multilayer electronic component, comprising:
a plurality of first electrode layers, each first electrode layer comprising:
a first dielectric layer having first and second surfaces thereof bounded by four edges;
a first conductive layer covering a portion of one of said first and second surfaces of said first dielectric layer and extending to at least a portion of one edge of said first dielectric layer; and
a second conductive layer covering a portion of one of said first and second surfaces of said first dielectric layer and extending to at least a portion of said one edge of said first dielectric layer;
a plurality of second electrode layers alternately stacked with said plurality of first electrode layers, each second electrode layer comprising:
a second dielectric layer having first and second surfaces thereof bounded by four edges;
a third conductive layer covering a portion of one of said first and second surfaces of said second dielectric layer and extending to at least a portion of one edge of said second dielectric layer; and
a fourth conductive layer covering a portion of one of said first and second surfaces of said second dielectric layer and extending to at least a portion of said one edge of said second dielectric layer;
a first conductive termination layer covering a portion of said at least one edge of said pluralities of first and second electrode layers and electrically connecting said first conductive layer of each of said plurality of first electrode layers and said fourth conductive layer of said second electrode layer; and
a second conductive termination layer covering a portion of said at least one edge of said pluralities of first and second electrode layers and electrically connecting said second conductive layer of each of said plurality of first electrode layers to said third conductive layer of said second electrode layer;
wherein said first conductive termination layer and said second conductive termination layer are configured so as to form a gap therebetween along a portion of said at least one edge of both said first and second electrode layers;
whereby a minimum current loop area is formed from said first conductive termination layer through said plurality of first electrode layers and plurality of second electrode layers to said second conductive termination layer.

18. A multilayer electronic component as in claim 17, further comprising:
a plurality of third electrode layers alternately stacked with said plurality of first and second electrode layers, each third electrode layer comprising:
a third dielectric layer having first and second surfaces thereof bounded by four edges;
a fifth conductive layer covering a portion of one of said first and second surfaces of said first dielectric layer and extending to at least a portion of one edge of said third dielectric layer; and
a sixth conductive layer covering a portion of one of said first and second surfaces of said third dielectric layer and extending to at least a portion of one edge of said third dielectric layer,
wherein said first conductive termination layer covers a portion of said at least one edge of said pluralities of first, second, and third electrode layers and electrically connects said first conductive layer of each of said plurality of first electrode layers, said fourth conductive layer of each of said second electrode layers, and said fifth conductive layer of each of said third electrode layers; and
wherein said second conductive termination layer covers a portion of said at least one edge of said pluralities of first, second, and third electrode layers and electrically connects said second conductive layers of each of said plurality of first electrode layers to said third conductive layers of each of said second electrode layer and said sixth conductive layers of each of said third electrode layer.

19. A multilayer electronic component as in claim 17, wherein said first and second conductive layers are selected from the group consisting of platinum, nickel, copper, and palladium-silver alloy.

20. A multilayer electronic component as in claim 17, wherein said first and second dielectric layers are selected from the group consisting of barium titanate, zinc oxide, alumina with low-fire glass, ceramics, glass-bonded materials, and an organic epoxy.

21. A multilayer electronic component as in claim 18, wherein said fifth and sixth conductive layers each extend to a portion of three edges of said of said third dielectric layer.

22. A method of making a low equivalent series inductance (ESL) multilayer electronic component, comprising:
providing a plurality of first electrode layers, each first electrode layer comprising a first dielectric layer having first and second surfaces thereof bounded by four edges and a first conductive layer covering a portion of one of said first and second surfaces of said first dielectric layer and extending to at least a portion of one edge of said first dielectric layer;
providing a plurality of second electrode layers, each second electrode layer comprising a second dielectric layer having first and second surfaces thereof bounded by four edges and a second conductive layer covering a portion of one of said first and second surfaces of said second dielectric layer and extending to at least a portion of one edge of said second dielectric layer, with the second conductive layer formed as a mirror image of the first conductive layer;
stacking the first and second plurality of electrode layers in respective alternating layers;
providing a first conductive termination layer electrically connecting respective first conductive layers of said plurality of first electrode layers;
providing a second conductive termination layer electrically connecting respective second conductive layers of said plurality of second electrode layers; and
configuring the first and second conductive termination layers so as to form a gap therebetween along a portion of said at least one edge of both said first and second electrode layers.

23. The method of claim 22, further comprising:
extending the first conductive layer to at least two portions of one edge of the first dielectric layer; and
extending the second conductive layer to at least two portions of one edge of the second dielectric layer.

24. The method of claim 22, further comprising:
extending the first conductive layer to at least one portion of each of opposite edges of the first dielectric layer; and
extending the second conductive layer to at least one portion of each of opposite edges of the second dielectric layer.

25. The method of claim 22, further comprising:
providing a third conductive layer covering a portion of said first surface of said first dielectric layer and extending to at least a portion of said one edge of said first dielectric layer; and
providing a fourth conductive layer covering a portion of said first surface of said second dielectric layer and extending to at least a portion of said one edge of said second dielectric layer.

26. The method of claim 25, wherein the step of configuring the first and second conductive termination layers includes forming plural interdigitated fingers separated by gaps over a surface formed from the stack of electrode layers comprising said one edge of each of the stacked first and second plurality of electrode layers.

27. The method of claim 25, further comprising:
providing a plurality of third electrode layers, each third electrode layer comprising a third dielectric layer having first and second surfaces thereof bounded by four edges;
providing a fifth conductive layer covering a portion of said first surface of said first dielectric layer and extending to at least a portion of said one edge of said third dielectric layer;
providing a sixth conductive layer covering a portion of one said first surface of said third dielectric layer and extending to at least a portion of said one edge of said third dielectric layer; and
stacking the plurality of third electrode layers alternately with the plurality of first and second electrode layers.

28. The method of claim 26, further comprising:
masking a portion of the interdigitated fingers prior to the respective steps of providing the first and second conductive termination layers, so that such masking inhibits shorting of the interdigitated fingers during the respective steps of providing the first and second termination layers.

29. The method of claim 27, further comprising:
extending the fifth conductive layer to three edges of the third dielectric layer; and
extending the sixth conductive layer to three edges of the third dielectric layer.

* * * * *